US008133341B2

(12) United States Patent
Nealey et al.

(10) Patent No.: US 8,133,341 B2
(45) Date of Patent: Mar. 13, 2012

(54) MOLECULAR TRANSFER PRINTING USING BLOCK COPOLYMERS

(75) Inventors: Paul Franklin Nealey, Madison, WI (US); Shengxiang Ji, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 97 days.

(21) Appl. No.: 12/416,816

(22) Filed: Apr. 1, 2009

(65) Prior Publication Data

US 2009/0260750 A1   Oct. 22, 2009

Related U.S. Application Data

(60) Provisional application No. 61/072,744, filed on Apr. 1, 2008.

(51) Int. Cl.
| B44C 1/17 | (2006.01) |
| B44C 1/24 | (2006.01) |
| B32B 37/10 | (2006.01) |
| B32B 37/24 | (2006.01) |
| B29C 65/02 | (2006.01) |
| B32B 38/10 | (2006.01) |

(52) U.S. Cl. ......... 156/234; 156/230; 156/242; 156/277
(58) Field of Classification Search .................. 156/230, 156/234, 242, 277
See application file for complete search history.

(56) References Cited

U.S. PATENT DOCUMENTS

| 3,444,732 | A | * | 5/1969 | Mckinley et al. ........... 73/150 A |
| 4,235,657 | A | * | 11/1980 | Greenman et al. ............ 156/234 |
| 5,948,470 | A | | 9/1999 | Harrison et al. |
| 6,746,825 | B2 | | 6/2004 | Nealey et al. |
| 6,926,953 | B2 | | 8/2005 | Nealey et al. |
| 7,704,432 | B2 | * | 4/2010 | Dumond et al. ........... 264/297.4 |
| 7,901,607 | B2 | * | 3/2011 | Xu et al. .................... 264/297.4 |
| 7,959,975 | B2 | * | 6/2011 | Millward ...................... 427/260 |
| 2003/0091752 | A1 | | 5/2003 | Nealey et al. |
| 2003/0091865 | A1 | | 5/2003 | Chen et al. |
| 2004/0143063 | A1 | | 7/2004 | Chen et al. |
| 2006/0134556 | A1 | * | 6/2006 | Nealey et al. ................. 430/311 |
| 2007/0092721 | A1 | * | 4/2007 | Kishimoto .................... 428/343 |
| 2007/0095469 | A1 | * | 5/2007 | Burdinski ..................... 156/277 |
| 2008/0257187 | A1 | | 10/2008 | Millward |

(Continued)

FOREIGN PATENT DOCUMENTS

JP   2007/125699   5/2007
(Continued)

OTHER PUBLICATIONS

U.S. Appl. No. 11/545,060, filed Oct. 5, 2006, Nealey et al.
(Continued)

*Primary Examiner* — Sonya Mazumdar
(74) *Attorney, Agent, or Firm* — Weaver Austin Villeneuve & Sampson LLP

(57) ABSTRACT

Methods of creating and transferring chemical patterns and physical patterns of deposited materials or molecules using block copolymers are provided. The methods involve providing block copolymer materials blended with one or more transfer molecules or inks. The differences in chemistry of the blocks of the copolymer that result in micro-phase separation (e.g., self-assembly into nanoscale domains) also allow inks to be sequestered into specific blocks. By designing the ink molecules to react, adsorb, or otherwise interact with a second substrate, inks are transferred to the second substrate in a pattern dictated by the pattern of block copolymer domains present at the surface of the block copolymer film.

23 Claims, 20 Drawing Sheets

U.S. PATENT DOCUMENTS

2010/0255268 A1* 10/2010 Choi et al. .................. 428/195.1

FOREIGN PATENT DOCUMENTS

| | | |
|---|---|---|
| JP | 2007/138052 | 6/2007 |
| JP | 2007/313568 | 12/2007 |
| WO | 2006112887 | 6/2006 |
| WO | 2007/111215 A | 10/2007 |
| WO | WO 2007111215 A1 * | 10/2007 |
| WO | WO 2009146086 A3 * | 3/2010 |

OTHER PUBLICATIONS

U.S. Appl. No. 11/580/694, filed Oct. 12, 2006, Nealey et al.
U.S. Appl. No. 11/879,758, filed Feb. 17, 2007, Nealey et al.
Written Opinion dated May 2, 2007 issued in WO2006112887.
Preliminary Examination Report dated May 30, 2007 issued in WO2006112887.
Asakawa et al. (2002) Nanopatterning with Microdomains of Block Copolymers using Reactive-Ion Etching Selectivity, *Jpn. J. Appl. Phys.* vol. 41 (2002) pp. 6112-6118.
Bates et al. (1990) Block Copolymer Thermodynamics: Theory and Experiment, *Annu.Rev.Phys. Chem.*, 1990, 41: pp. 525-557.
Bates et al. (1995) Isotropic Lifshitz Behavior in Block Copolymer-Homopolymer Blends, *Phy Rev Ltrs,* vol. 75, No. 24, Dec. 11, 1995.
Bates et al. (1997) Polymeric Bicontinuous Microemulsions, *Phy Rev Ltrs,* vol. 69, No. 5, Aug. 4, 1997.
Bates, et al., "Block Copolymers—Designer Soft Materials," *Physics Today*, Feb. 1999, 7 pages.
Berreman et al. (1990) Use of trilevel resists for high-resolution soft-x-ray projection lithography, *Appl. Phys Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Black, C.T., et al, "Polymer Self Assembly in Semiconductor Microelectronics," IBM Journal of Research and Development, *International Business Machines Corporation*, New York, vol. 51, No. 5, Sep. 1, 2007, XP007905680, pp. 605-633.
Bohbot-Raviv, et al., "Discovering New Ordered Phases of Block Copolymers," *The American Physical Society*, vol. 85, No. 16, Oct. 16, 2000, 4 pages.
Boltau et al. (1998) Surface-induced structure formation of polymer blends on patterned substrates, *Nature*, vol. 391, Feb. 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al. (2000) T-Junction Grain Boundaries in Block Copolymer-Homopolymer Blends, *Macromolecules*, vol. 33, pp. 8739-8745.
Campbell et al. (2000) Fabrication of photonic crystals for the visible spectrum by holographic lithography, *Nature*, vol. 404, Mar. 2, 2000, p. 53.
Cardinale et al. (1999) Demonstration of pattern transfer into sub-100 nm polysilicon line/space features patterned with extreme ultraviolet lithography, *J. Va. Sci. Technol. B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer films on chemically patterned substrates, *Journal of Chemical Physics*, Apr. 22, 1998, vol. 108, No. 16, p. 6897.
Cheng et al.(2001) Formation of a Cobalt Magnetic Dot array via Block Copolymer Lithography, *Advanced Materials*, vol. 13, No. 15, Aug. 3, 2001, pp. 1174-1178.
Cheng et al. (2002) Fabrication of nanostructures with long-range order using block copolymer lithography, *Applied Physics Letters*, vol. 81, No. 19, Nov. 4, 2002, p. 3657.

Cheng et al. (2003) Templated Self-Assembly of Block Copolymers: Effect of Substrate Topography, *Advanced Materials* 2003, vol. 15, No. 19, Oct. 2, pp. 1599-1602.
Corvazier et al. (2001) Lamellar phases and microemulsions in model ternary blends containing amphiphilic block copolymers, The Royal Society of Chemistry, *J. Mater. Chem*, 2001, 11, pp. 2864-2874.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, *Macromolecules*, vol. 26, pp. 1582-1589.
Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.
Daoulas et al. (2006) Fabrication of Complex Three-Dimensional Nanostructures from Self-Assembling Block Copolymer Materials on Two-Dimensional Chemically Patterned Templates with Mismatched Symmetry, *Physical Review Letters*, Jan. 27, 2006, PRL 96, 036104.
Daoulas et al. (2006) Morphology of multi-component polymer systems: single chain in mean field simulation studies, *The Royal Society of Chemistry, Soft Matter*, 2006, vol. 2, pp. 573-583.
Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.
Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.
Detcheverry, et al., Monte Carlo Simulation of Coarse Grain Polymeric Systems, *The American Physical Society*, May 15, 2009, PRL 102(19) 197801(4), pp. 197801-1-197801-4.
Detcheverry, et al., Monte Carlo Simulations of a Course Grain Model for Block Copolymers and Nanocomposites, published Jun. 11, 2008, vol. 41, pp. 4989-5001.
Detcheverry, et al, "Simulations of Theoretically Informed Coarse Grain Models of Polymeric Systems," Faraday Discussions, 2009, vol. 144, pp. 11-125.
Düchs et al. (2003) Fluctuation Effects in Ternary AB + A + B Polymeric Emulsions, *Macromolecules* V36, pp. 9237-9248.
Düchs et al. (2004) Formation and structure of the microemulsion phase in two-dimensional ternary Ab+A+B Polymeric emulsions, *Jnl of Chem Phy*, vol. 121, No. 6, Aug. 8, 2004, p. 2798.
Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-344.
Edwards et al. (2004) Precise Control over Molecular Dimensions of Block-Copolymer Domains Using the Interfacial Energy of Chemically Nanopatterned Substrates, *Advanced Materials*,2004, vol. 16, No. 15, Aug. 4, pp. 1315-1319.
Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.
Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.
Edwards, et al., "Mechanism and Kinetics of Ordering in Diblock Copolyer Thin Films on Chemically Nanopatterned Substrates," *Journal of Polymer Science*: Part B, Polymer Physics, 2005, vol. 43, pp. 3444-3459.
Ekinci, et al., "20 nm Line/Space Patterns in HSQ Fabricated by EUV Interference Lithography," *Photon Lithography*, MNE 2006 Micro- and Nano- Engineering, 2 pages.
Fasolka et al. (2000) Morphology of Ultrathin Supported Diblock Copolymer Films: Theory and Experiment, *Macromolecules* vol. 33, pp. 5702-5712.

Floudas et al. (1997) Microphase separation in block copolymer/homopolymer blends: Theory and experiment, *J. Chem. Phys.* 106 (8), Feb. 22, 1997, p. 3318.

Fukukawa et al. (2005) Synthesis and Characterization of Silicon-Containing Block Copolymers from Nitroside-Mediated Living Free Radical Polymerization, *Macromolecules* vol. 38, pp. 263-270.

Galatsis, K., et al., Patterning and Templating for Nanoelectronics., *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.

Helfand et al. (1972) Theory of the Interface between Immiscible Polymers,II, *Journal of Chemical Physics*, vol. 56, No. 7, Apr. 1, 1972.

Hillmyer et al. (1991) Model Bicontinuous Microemulsions in Ternary Homopolymer/Block Copolymer Blends, *J. Phy. Chem.* B 1999, 103, pp. 4814-4824.

Hirai, et al., "One-Step Direct-Patterning Template Utilizing Self-Assembly of POSS-Containing Block Copolymers," *Adv. Mater*, 2009, vol. 21, pp. 4334-4338.

Hong, A., et al., "Metal Nanodot Memory by Self-Assembled Block Copolymer Lift-Off," *American Chemical Society*, Nano Left 2010, vol. 10, pp. 224-229.

Huang et al. (1991) Modeling Copolymer Adsorption on Laterally Heterogeneous Surfaces, *Physical Review Letters*, Feb. 4, 1991, vol. 66, No. 5, p. 620.

In, et al., Side-Chain-Grafted Random Copolymer Brushes as Neutral Surfaces for Controlling the Orientation of Block Copolymer Microdomains in Thin Films, *American Chemical Society*, Langmuir, published Aug. 1, 2006, vol. 22, pp. 7855-7860.

Jeong et al. (2002) Asymmetric Block Copolymers with Homopolymers: Routes to Multiple Length Scale nanostructures, *Adv. Mater* 2002.,14, No. 4, Feb. 19, 2002, p. 274.

Jeong et al. (2003) Precise Control of Nanopore Size in Thin Film Using Mixtures of Asymmetric Block Copolymer and Homopolymer, *Macromolecules* 2003, 36, pp. 10126-10129.

Ji, et al., "Generalization of the Use of Random Copolymers to Control the Wetting Behavior of Block Copolymer Films," *American Chemical Society*, published Nov. 11, 2008, vol. 41, pp. 9098-9103.

Ji, et al., "Preparation of Neutral Wetting Brushes for Block Copolymer Films from Homopolymer Blends," *Advanced Materials*, 2008 vol. 20, pp. 3054-3060.

Ji, Shengxiang, et al., "Molecular Transfer Printing Using Block Copolymers," *ACSNano* vol. 4, No. 2, 2010, pp. 599-609.

Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.

Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

Kang, et al., "Hierarchical Assembly of Nanoparticle Superstructures from Block Copolymer-Nanoparticle Composites," published Apr. 9, 2008, vol. 100(4), pp. 148303-1-148303-4.

Kim et al. (2000) Chemical Modification of Self-Assembled Monolayers by Exposure to Soft X-rays in *Air, J. Phys. Chem.*, vol. 104, No. 31, 2000, pp. 7403-7410.

Kim et al. (2003) Epitaxial self-assembly of block copolymers on lithographically defined nanopatterned substrates, *Nature*, vol. 424, Jul. 24, 2003, Nature Publishing Group, p. 411.

Kim, et al., "Defect Structure in Thin Films of a Lamellar Block Copolymer Self-Assemble on Neutral Homogeneous and Chemically Nanopatterned Surfaces," *American Chemical Society*, Macromolecules, published Jul. 13, 2006, vol. 39, 5466-5470.

Kim, et al., "Synthesis of Photacid Generator-Containing Patternable Diblock Copolymers by Reversible Addition—Fragmentation Transfer Polmerization," *Chemistry of Materials, American Chemical Society*, Jul. 6, 2009, pp. 3030-3032.

Krishnan et al. (2001) Shear-Induced Nano-Macro Structural Transition in a Polymeric Bicontinuous Microemulsion, Phy Rev Ltrs, vol. 87, No. 9, Aug 27, 2001, p. 098301-1.

La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.

Li et al. (2000) Dense arrays of ordered GaAs nanostructures by selective area growth on substrates patterned by block copolymer lithography, Applied Physics Letters, vol. 76, No. 13, Mar. 27, 2000, pp. 1689-1691.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Mansky et al. (1997) Ordered Diblock Copolymer Films on Random Copolymer Brushes, *Macromolecules* 1997, 30, pp. 6810-6813.

Mansky et al. (2006) Controlling Polymer-Surface Interactions with Random Copolymer Brushes, http://www.jstor.org/, Wed. Aug. 16, 2006.

Messe et al. (2003) Effect of the Molecular weight of the homopolymers on the morphology in ternary blends of polystyrene, polyisoprene, polystyrene-block-polyisoprene copolymer, *Polymer*, 44 (2003) pp. 7397-7403.

Morin, et al., "Assembly of Nanocrystal Arrays by Block-Copolymer-Directed Nucleation," *Angew. Chem. Inc.*, Ed. 2009, vol. 48, pp. 2135-2139.

Morkved et al. (1999) Dynamics of ternary polymer blends: Disordered, ordered and bicontinouous microemulsion phases, Faraday Discuss.,1999, 112, pp. 335-350.

Morkved et al. (2001) Static and Dynamic Scattering from Ternary Polymer Blends: Bicontinuous Microemulsions, Lifshitz lines, and amphiphilicity, *Jnl of Chem Phy*, V.114, No. 16, Apr. 22, 2001, p. 7247.

Mortensen et al. (2000) Ternary mixture of homopolymer blend and diblock copolymer studied near the Lifshitz composition by small-angle neutron scattering, *J. Appl. Cryst.*, 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans.on Magnetics*, vol. 38, No. 5, Sep. 2002, p. 1949.

Nakano, et al., Single-Step Single-Molecure PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of~$10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Park, et al., "Characterization of Cylinder-Forming Block Copolymers Directed to Assemble on Spotted Chemical Patterns," *American Chemical Society*, Macromolecules, Published Nov. 4, 2008, vol. 41, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing A Diblock Copolymer Template," IEEE 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27, 2009, vol. 131, pp. 084903-1to 084903-10.

Rockford et al. (1999) Polymers on Nanoperiodic, Heterogeneous Surfaces, *Phy. Rev. Ltrs, The American Physical Society*, vol. 82, No. 12, p. 2602.

Ruiz, et al., "Density Multiplication and Improved Lithography by Directed block Copolymer Assembly," *Science*, vol. 321, Aug. 15, 2008, pp. 936-939.

Russell et al. (1989) Characteristics of the Surface-Induced Orientation for Symmetric Diblock PS/PMMA Copolymers, *Macromolecules*, vol. 22, pp. 4600-4606.

Schattenburg et al. (1995) Optically matched trilevel resist process for nanostructure fabrication, *J. Vac. Sci Technol. B*, 15(6), Nov./Dec. 1995, p. 3007.

Schwahn et al. (1999) Crossover from 3D Ising to Isotropic Lifshitz Critical Behavior in a Mixture of a Homopolymer Blend and Diblock Copolymer, *Phy. Rev. Ltrs, The American Physical Society*, vol. 82, No. 25, Jun. 21, 1999, p. 5056.

Schwahn et al. (2000) Thermal Composition fluctuations near the isotropic Lifshitz critical point in a ernary mixture of a homopolymer blend and diblock copolymer, *Jnl. Chem. Phy.*, vol. 112, No. 12, Mar. 22, 2000, p. 5454.

Solak, et al., "Sub-50 nm Period Patterns With EUV Interference Lithography," *Microelectronic Engineering* 67-68 (2003) 56-62.

Solak, Harun H. (2006) Nanolithography with coherent extreme ultraviolet light, *Jnl. of Physics D: App. Phys*,39 (2006) R171-R188.

Son, et al., "Placement Control of Nanomaterial Arrays on the Surface-Reconstructed Block Copolymer Thin Films," *ACSNano*, vol. 3, No. 12, 2009, pp. 3927-3934.

Son, et al., "Surfactant-Assisted Orientation of Thin Diblock Copolyer films," *Advanced Materials*, 2008, vol. 20, pp. 3643-3648.

Stoykovich et al. (2005) Directed Assembly of Block Copolymer Blends into Nonregular Device-Oriented Structures, Science, vol. 308, Jun. 3, 2005, www.sciencemag.org, p. 1442.

Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).

Stoykovich, M.P., et al, "Block Copolymers and Conventional Lithography," *Materials Today*, Elsevier Science, Kidlington, GB, vol. 9, No. 9, Sep. 1, 2006, pp. 20-29.

Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.

Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.

Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.

Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.

Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.

Teubner et al. (1987) Origin of the Scattering Peak in Microemulsions, *J. Chem. Phys.*, 87(5), Sep. 1, 1997, p. 3195.

Thurn-Albrecht et al. (2000) Nanoscopic Templates from Oriented Block Copolymer Films, Communications, *Advanced Materials*, vol. 12, No. 11, pp. 787-791.

Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.

Ting, et al., "Plasma Etch Removal of Poly (methyl methacrylate) in Block Copolymer Lithography," *J. Vac. Sci. Technol.*, vol. 26(5), Sep./Oct. 2008, pp. 1684-1689.

Torikai et al. (1997) Lamellar Domain Spacings of Diblock Copolymer/Homopolymer Blends and Conformations of Block Chains in Their Microdomains, *Macromolecules*, 30, pp. 5698-5703.

Urbas et al. (2000) Tunable Block Copolymer/Homopolymer Photonic Crystals, *Advanced Materials*, vol. 12, No. 11 p. 812.

Urbas et al. (2002) Bicontinuous Cubic Block Copolymer Photonic Crystals, *Advanced Materials*, vol. 14, No. 24, Dec. 17, 2002, p. 1850.

Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.

Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.

Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.

Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.

Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.

Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.

Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.

Welander, et al., "Rapid Directed Assembly of Block Copolymer Films at Elevated Temperatures," American Chemical Society, Macromolecules, vol. 41, Published Apr. 1, 2008, pp. 2759-2761.

Whitesides et al. (1991) Molecular self-Assembly and Nanochemistry: A Chemical Strategy for the Synthesis of Nanostructures, *Articles, Science* vol. 254, p. 1312, Nov. 29, 1991.

Whitesides et al. (2002) Self-Assembly at All Scales, *Science, AAAS*, 295, p. 2418.

Xiao, et al., "Graphoepitaxy of Cylinder-forming Block Copolymers for Use as Templates to Pattern Magnetic Metal Dot Arrays," Institute of Physics Publishing, Nanotechnology, vol. 16, 2005, pp. S324-S329.

Xu et al. (2001) The Influence of molecular weight on nanoporous polymer films, *Polymer*, 42 (2001) pp. 9091-9095; www.elsevier.com/locate/polymer.

Yang et al. (2000) Guided Self-Assembly of Symmetric Diblock Copolymer Films on Chemically Nanopatterned Substrates, *Macromolecules* 2000, 33, pp. 9575-9582.

Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.

Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.

Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.

Nealey, Paul Franklin, et al., "Density Multiplication and Improved Lithography by Directed Block Copolymer Assembly," U.S. Appl. No. 12/329,484, filed Dec. 5, 2008.

International Search Report and Written Opinion of the International Searching Authority mailed Aug. 24, 2009, Application No. PCT/US 2008/085742, 14 pages.

International Search Report and Written Opinion of the International Searching Authority mailed Dec. 16, 2009, Application No. PCT/US2009/039208.

Nealey, Paul Franklin, et al., "Methods and Compositions for Forming a Periodic Patterned Copolymer Films," U.S. Appl. No. 11/286,260, filed Nov. 22, 2005.

U.S. Office Action mailed Jul. 31, 2009, from U.S. Appl. No. 11/286,260.

U.S. Office Action mailed Jan. 25, 2010, from U.S. Appl. No. 11/286,260.

International Search Report dated May 2, 2007 issued in WO2006112887.

Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.

U.S. Office Action mailed Apr. 3, 2009, from U.S. Appl. No. 11/545,060.

U.S. Office Action mailed Nov. 30, 2009, from U.S. Appl. No. 11/545,060.

Nealey, Paul Franklin, "Directed Assembly of Triblock Copolymers," U.S. Appl. No. 11/580,694, filed Oct. 12, 2006.

U.S. Office Action mailed Dec. 2, 2009, from U.S. Appl. No. 11/580,694.

Stoykovich, Mark P., et al., "Methods and Compositions for Forming Patterns With Isolated or Discrete Features Using Block Copolymer Materials," U.S. Appl. No. 11/879,758, filed Jul. 17, 2007.

U.S. Office Action mailed Jul. 23, 2009, from U.S. Appl. No. 11/545,060.

U.S. Final Office Action mailed Mar. 8, 2010, from U.S. Appl. No. 11/545,060.

Office Action mailed Apr. 21, 2011 for Appl. No. 12/329,484.

Watanabe, et al., "Smart Block Copolymer Masks With Molecule-Transport Channels for Total Wet Nanopatterning," *J. Mater. Chem.*, 2008, vol. 18, 5482-5491.

* cited by examiner

Spheres

⊥ Cylinders

|| Cylinders

Lamellae

47.5 nm period
twentieth cycle 47.5 nm period
first cycle 47.5 nm period
twentieth replica 47.5 nm period
first replica Transfer of complicated fingerprint pattern from mesa (50 nm in relief)

~25 nm features 15 nm feature

MOLECULAR TRANSFER PRINTING USING BLOCK COPOLYMERS

CROSS-REFERENCE TO RELATED APPLICATION

This application claims benefit under 35 U.S.C. §119(e) to U.S. Provisional Patent Application No. 61/072,744, filed Apr. 1, 2008, titled "Molecular Transfer Printing Using Block Copolymers," which application is incorporated by reference herein in its entirety.

STATEMENT OF GOVERNMENT SUPPORT

This invention was made with United States government support awarded by the following agencies: DOD DARPA HR0011-04-3-0002 and NSF 0425880. The United States government has rights in this invention.

FIELD OF THE INVENTION

The invention relates to methods of nanofabrication techniques. More specifically, the invention relates to transferring chemical patterns at the nanoscale level utilizing block copolymers.

BACKGROUND OF THE INVENTION

As the development of nanoscale mechanical, electrical, chemical and biological devices and systems increases, new processes are needed to fabricate nanoscale devices and components. This is especially true as the scale of these structures decreases to the tens of nanometers and below. The creation and replication of patterns is a key operation in the fabrication process. For example, in chip fabrication, optical lithography tools may be used to print the circuit patterns. However, optical lithography is prohibitively expensive as length scales decrease, and may reach technological impasses at about 30 nanometers and below.

SUMMARY OF THE INVENTION

Methods of creating and transferring chemical patterns and physical patterns of deposited materials or molecules using block copolymers are provided. The methods involve providing block copolymer materials blended with one or more transfer molecules or inks. The differences in chemistry of the blocks of the copolymer that result in micro-phase separation (e.g., self-assembly into nanoscale domains) also allow inks to be sequestered into specific blocks. By designing the ink molecules to react, adsorb, or otherwise interact with a second substrate, inks are transferred to the second substrate in a pattern dictated by the pattern of block copolymer domains present at the surface of the block copolymer film.

One aspect of the invention relates to transferring inks to a substrate using block copolymer materials. In certain embodiments, the inks or molecules to be transferred in the process are mixed with block copolymers and deposited as films on a substrate. An ink (or each type of ink) is compatible with only one block of the copolymer, and after self-assembly of the blend material, the inks are sequestered into domains of nanometer scale dimensions. A second, "transferee" substrate is then placed in contact with the surface of the block copolymer film. By designing the ink molecules to react, adsorb, or otherwise interact with the second substrate, for example upon annealing the sandwiched film such that the block copolymer film becomes rubbery and allows for efficient mass transfer, inks are transferred to the second substrate in the exact pattern of block copolymer domains present at the surface of the block copolymer film. The differences in the chemistry of the blocks of the copolymer that result in microphase separation (self-assembly into nanoscale domains) also allow inks to be sequestered into specific blocks and prevent lateral mass transfer during the printing step, which otherwise would cause smearing or limit the resolution of the technique. One or as many chemically distinct inks as there are blocks can be patterned at once.

One aspect of the invention relates to a method of printing a chemical pattern on a substrate. The method involves providing a block copolymer/ink blend film. The blend film includes a microphase-separated block copolymer material and at least one ink preferentially segregated in at least one of the blocks of the block copolymer material. For example, in an A-b-B film, either or both of components may be inked; in a A-b-B film exhibiting a spherical morphology, the spheres may be inked, the material surrounding the spheres may be inked, or both of these areas may be inked with different inks. The methods then involve transferring at least one ink to a transferee substrate to thereby print a chemical pattern on the transferee substrate. The transferred chemical pattern is defined by the microphase-separated domains of the block copolymer at a surface of the blend film. The transferred chemical pattern may contain inked and uninked regions, or may be all inked.

In certain embodiments, providing a block copolymer/ink blend film involves directing the assembly of a block copolymer film on a first chemically patterned substrate. Patterns are printed on the transferee substrate by mass transfer of the inks, which attach to the transferee substrate by interaction with it. The interaction may include chemical reaction, adsorption, absorption or other interaction. The form and/or structure of the ink molecule may be changed during this transfer process. Bifunctional inks—e.g., an ink having a first functional group to interact with the transferee substrate and a second functional group to polymerize and/or conjugate another molecule to the transferee substrate may be used.

In certain embodiments, the molecular transfer printing process involves physically contacting, e.g., by pressing, the blend film with the transferee substrate to create a sandwich structure. Contact may be made in a variety of manners including conformally depositing a second substrate material on at least a portion of the blend film. The printing process may also involve providing other conditions conducive to mass transfer of the ink or inks to the transferee substrate. In certain embodiments, this may involve heating or providing some other type of energy to the sandwich structure. For example, in certain embodiments, transfer of an ink that includes a homopolymer of one of the components of the block copolymer material involves heating the substrate to at least 5° C. or 10° C. above its glass transition temperature. In other embodiments, the printing process may occur at or near room temperature, or at lower temperatures.

The blend film surface is chemically patterned, with the pattern formed by features of the block copolymer domains. Topographical features, e.g., at larger length scales of the block copolymer domains, may also be present. In certain embodiments, at least a portion of blend film surface is without topographical features, wherein said portion includes multiple features of the pattern to be transferred.

Another aspect of the invention relates to a method of generating a replica of a chemical pattern. The method involves providing a first substrate having a master template comprising a microphase-separated block copolymer material and at least one ink preferentially segregated in at least one of the blocks of the block copolymer material film, transferring at least one ink to a transferee substrate to thereby print a chemical pattern on a transferee substrate, wherein the chemical pattern is defined by the microphase-separated domains of the block copolymer at a surface of the blend film; and directing assembly of a block copolymer film on the transferee substrate based on the chemical pattern printed thereon to thereby form a replica of the master template.

In certain embodiments, the method involves directing the assembly of a block copolymer film on a chemically nano-patterned surface to generate the master template. The first substrate may have a lithographically patterned surface. According to various embodiments, the master template may be reused to generate one or more additional replicas. The master template may be regenerate on the first substrate. In embodiments wherein the transferee substrate has uninked regions from the molecular transfer printing process, one or more additional inks or other molecules may be added to the uninked areas to form the chemical pattern on which the block copolymer film is assembled to form the replica.

These and other aspects of the invention are described in further detail and with reference to the following figures below.

BRIEF DESCRIPTION OF THE DRAWINGS

FIG. 12 shows SEM images of a master template regenerated after the first cycle, and that regenerated after the twentieth cycle in an example of molecular transfer printing according to the method illustrated in FIG. 7a.

FIG. 13 shows SEM images of the first and twentieth replicas generated in an example of molecular transfer printing according to the method illustrated in FIG. 7a.

FIG. 14 is an SEM image of the block copolymer film directed to assemble on a replica of a fingerprint pattern transferred in an example according to the method illustrated in FIG. 11a.

DESCRIPTION OF THE INVENTION

1. Introduction

Figure 1:
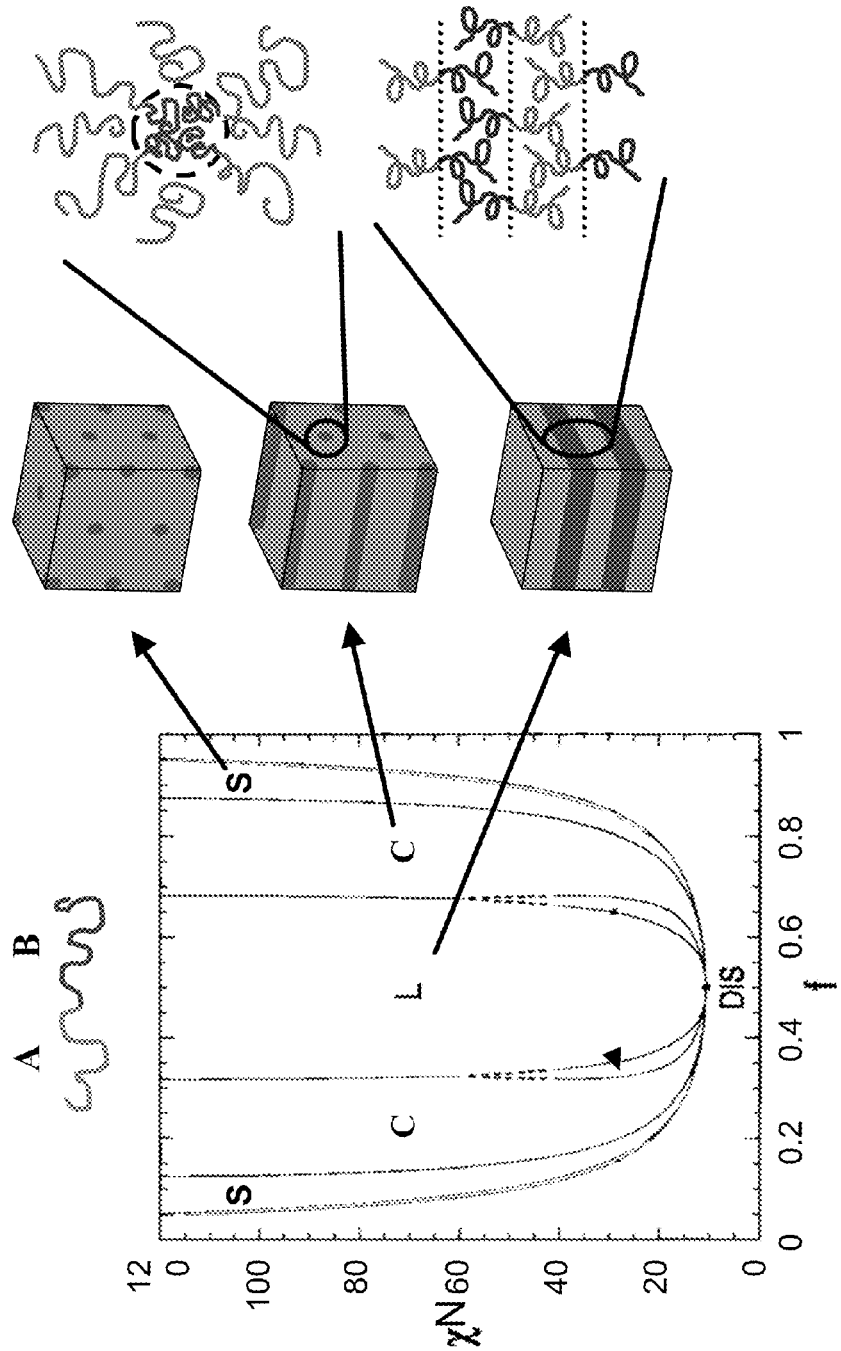
FIG. 1 shows ideal phase behavior of diblock copolymers.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The methods of the invention involve molecular transfer printing using block copolymer materials. As described further below, block copolymer materials microphase separate into domains of different morphological features under appropriate thermodynamic conditions. Films of block copolymer materials and transfer molecules or inks are provided on substrates. The differences in chemistry of the blocks of the copolymer that result in microphase separation of the domains also allow the inks to be sequestered into specific blocks. The pattern existing at the top surface of the film can then be transferred to the second substrate.

According to various embodiments, the block copolymer (or other polymer) domains act as reservoirs of inks, conformal contact between the replica and the film is facilitated when the film is in the melt, and thermodynamic barriers at reservoir interfaces, even in the melt, prevent lateral mass transfer during printing. Master and replica may be separated by dissolving the block copolymer film in solvent. Upon subsequent deposition and assembly of films on the master and replica chemical pre-patterns, a second-generation master and a mirror-image replica pattern can be obtained.

The methods may be used to create and replicate chemical patterns at dimensions of block copolymer films—as low as 2 nm. The methods provide 1:1 nanoscale pattern replication with perfect or near-perfect resolution.

The methods may be used to create replicas from a master chemical or topographic pattern created, for example, by directing assembly on a substrate patterned using advanced lithographic tools. In certain embodiments, the blend of block copolymer and ink(s) is directed to assemble into periodic, non-regular, or integrated circuit regular fabric architectures on the lithographically defined templates. Under certain circumstances the assembled film exhibits 1) improvement over the lithographic pattern quality with respect to line width roughness and control over features dimensions, 2) resolution enhancement over the lithographic template, and/or 3) more complicated geometry at the surface of the assembled film than the lithographic template. This pattern at the surface of the assembled film can then be replicated by molecular transfer printing on the surface of another substrate. This chemical pattern in turn can direct the assembly of another block copolymer film, and the master can be reused.

The molecular transfer printing methods described herein provide advantages over conventional pattern transfer techniques. Lithographic techniques such as conventional photolithography, x-ray lithography, extreme ultraviolet (EUV) lithography or electron beam lithography are incapable of patterning at nanoscale dimensions or are prohibitively expensive. The methods described herein provide vastly simpler and cheaper means of generating and replicating chemical patterns.

The methods provide improvement over soft lithographic techniques, such as microcontact printing in which topographic stamps are created. Soft lithography techniques are incapable of patterning at such small length scales. The methods also provide superior generation and replication of patterns than other topographic methods, such as nanoimprint lithography: unlike with topographic methods, there are no depth of focus issues with patterning the molecularly thin imaging layer (lithographic template) as well as providing methods of resolution enhancement and improvement of pattern quality that are not possible with nanoimprint lithography.

As indicated above, the molecular transfer printing methods described use block copolymers. Block copolymers are a class of polymers that have two or more polymeric blocks. The structure of diblock copolymer AB, also denoted A-b-B, may correspond, for example, to AAAAAAA-BBBBBBBB. FIG. 1 shows theoretical phase behavior of diblock copolymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 2 or 3 to 50 nm. The phase behavior of block copolymers containing more than two types of blocks (e.g. A-b-B-b-C), also results in microphase separation into different domains. The size and shape of the domains depend on the molecular weight and composition of the copolymer.

Figure 2:
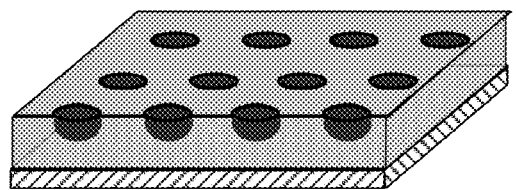
FIG. 2 shows spherical, cylindrical and lamellar ordered copolymer domains formed on substrates.
Figure 2:
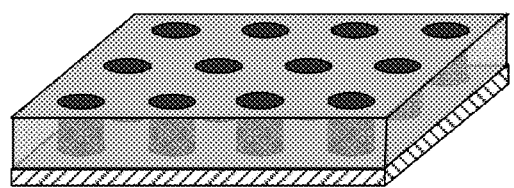
Figure 2:
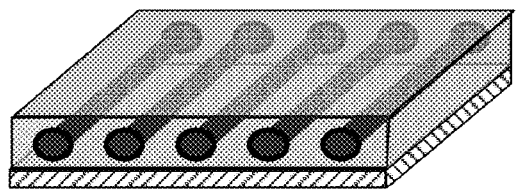
Figure 2:
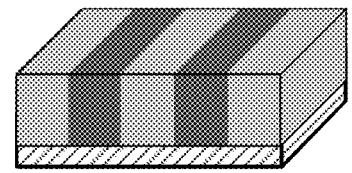

FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate. While the FIGS. 1 and 2 show phase behavior of diblock copolymers for illustrative purposes, the phase behavior of block copolymers containing more than two types of blocks (e.g., A-b-B-b-C) also results in microphase separation into different architectures.

Figure 3:
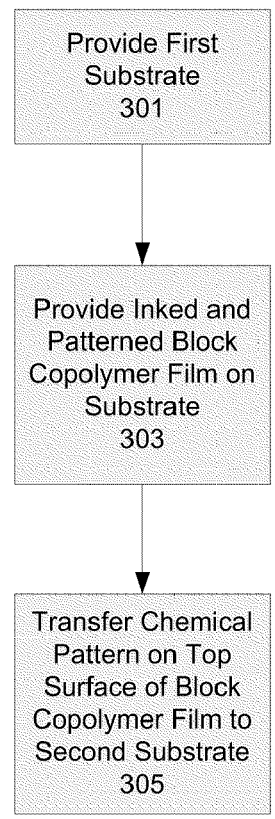
FIG. 3 is a flow diagram showing operations in a method of molecular transfer printing that uses directed assembly of a block copolymer film according to certain embodiments.

According to various embodiments, the methods of the invention involve incorporating inks or transfer molecules preferentially into a subset of the blocks of the block copolymer film. The pattern at the free surface of the film is then transferred to another substrate by mass transfer of the ink(s). FIG. 3 is a process flow diagram illustrating operations in accordance to certain embodiments. The process begins by providing a first substrate to support or underlay a block copolymer thin film (301). As discussed below, in many embodiments, the substrate is a lithographically patterned substrate that serves to direct assembly for a master template for generation of pattern replicas. In certain embodiments, the substrate may be chemically and/or topographically patterned. Also in certain embodiments, the substrate may be neutral or unpatterned.

Figure 4:
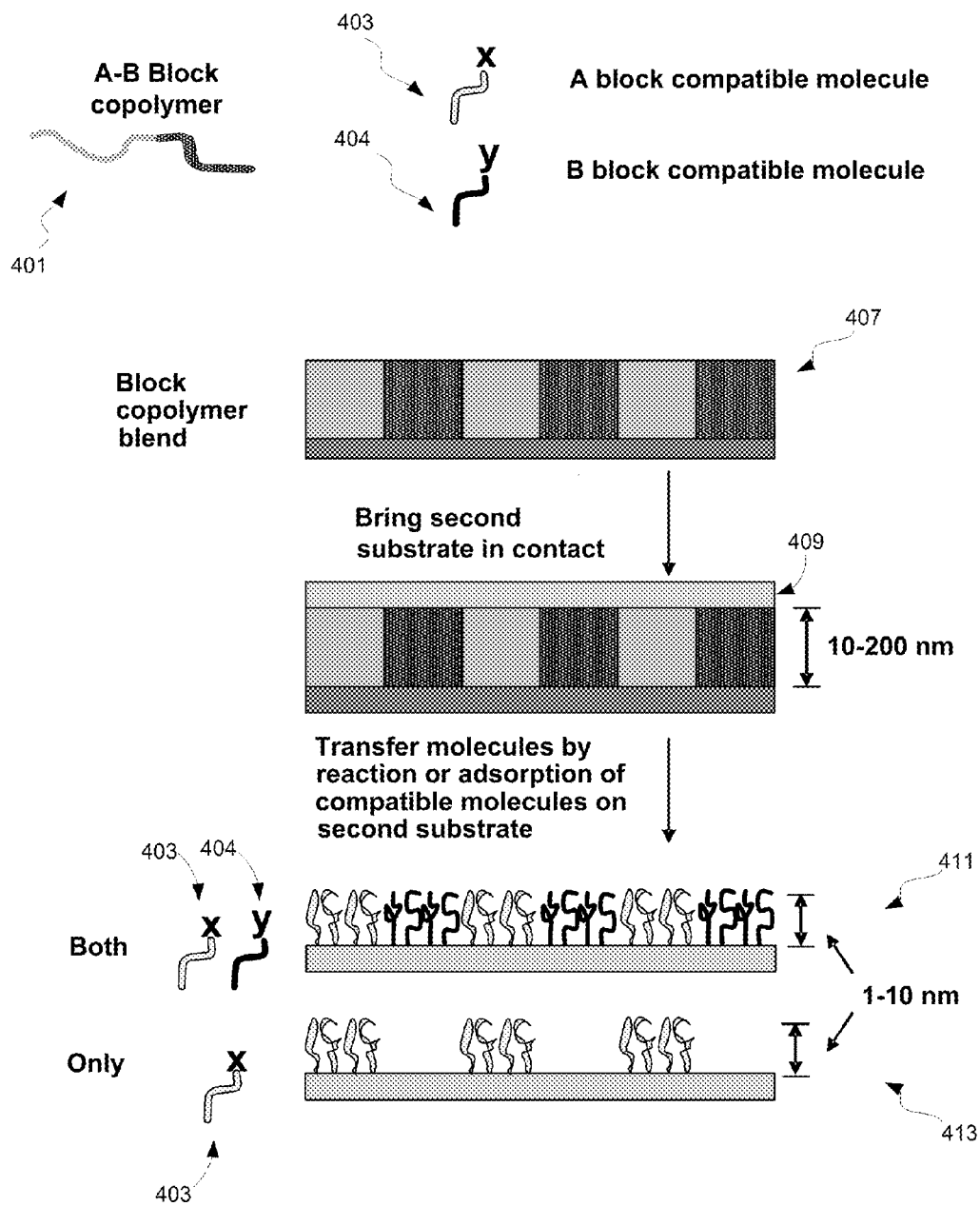
FIGS. 4, 5a and 5b are schematic diagrams showing operations in methods of molecular transfer printing according to certain embodiments.

A blend of block copolymer material and one or more inks is then provided on the substrate (303). The blend is microphase separated into different domains, e.g., as described above with respect to FIGS. 1 and 2. At least one of the domains contains an ink, i.e., molecules that may be transferred to another substrate, which preferentially exists in that domain. An example is shown in the schematic of FIG. 4, which shows an A-b-B diblock copolymer at 401. Two ink molecules or compounds, 403 and 404, are shown. In certain embodiments, an ink molecule is a polymer having a functional group that is used in the pattern transfer attached to it: in FIG. 4, x is the functional group of ink 403 and y is the functional group of ink 404. Ink 403 is preferential to block A of the A-b-B block copolymer, and ink 404 preferential to block B. A thin film of a blend of the block copolymer with the ink molecules on a substrate is indicated at 407. In the schematic, the material has undergone microphase separation, forming lamellar domains with the ink molecules located in the domains to which they are highly preferential, i.e., 403 in the A domain and the 404 in B domain. In other embodiments, only a subset of domains are inked, e.g., a blend may contain a A-b-B copolymer and only an A-preferential or B-preferential ink. Similarly, a blend A-b-B-b-C triblock copolymer may contain only inks preferential to A and B, etc. The inks may be added to the block copolymer prior to deposition of the material on the substrate, or may be added after the block copolymer film is deposited and/or assembled into nanoscale domains. Providing the blend may also involve performing various operations on the block copolymer film, including cross-linking it, etc.

Returning to FIG. 3, the pattern formed by the block copolymer domains at the free surface of the blended thin film is then transferred to a second substrate (305). This is done by mass transfer of the ink molecules to the second substrate, for example, in FIG. 4, substrate 409 is brought into contact with the thin film. Either both or one of the different inks may be transferred as desired by appropriately manipulating the ink molecules, the second substrate and the transfer technique. Schematic examples of both scenarios are shown in FIG. 4: both molecules 403 and 404 being transferred at 411 and only ink 403 at 413. In either case, the second substrate is chemically patterned in accordance with the pattern at the free surface of the thin film blend, in this case stripes or lamellae. The second substrate may be rigid or flexible.

Figure 5A:
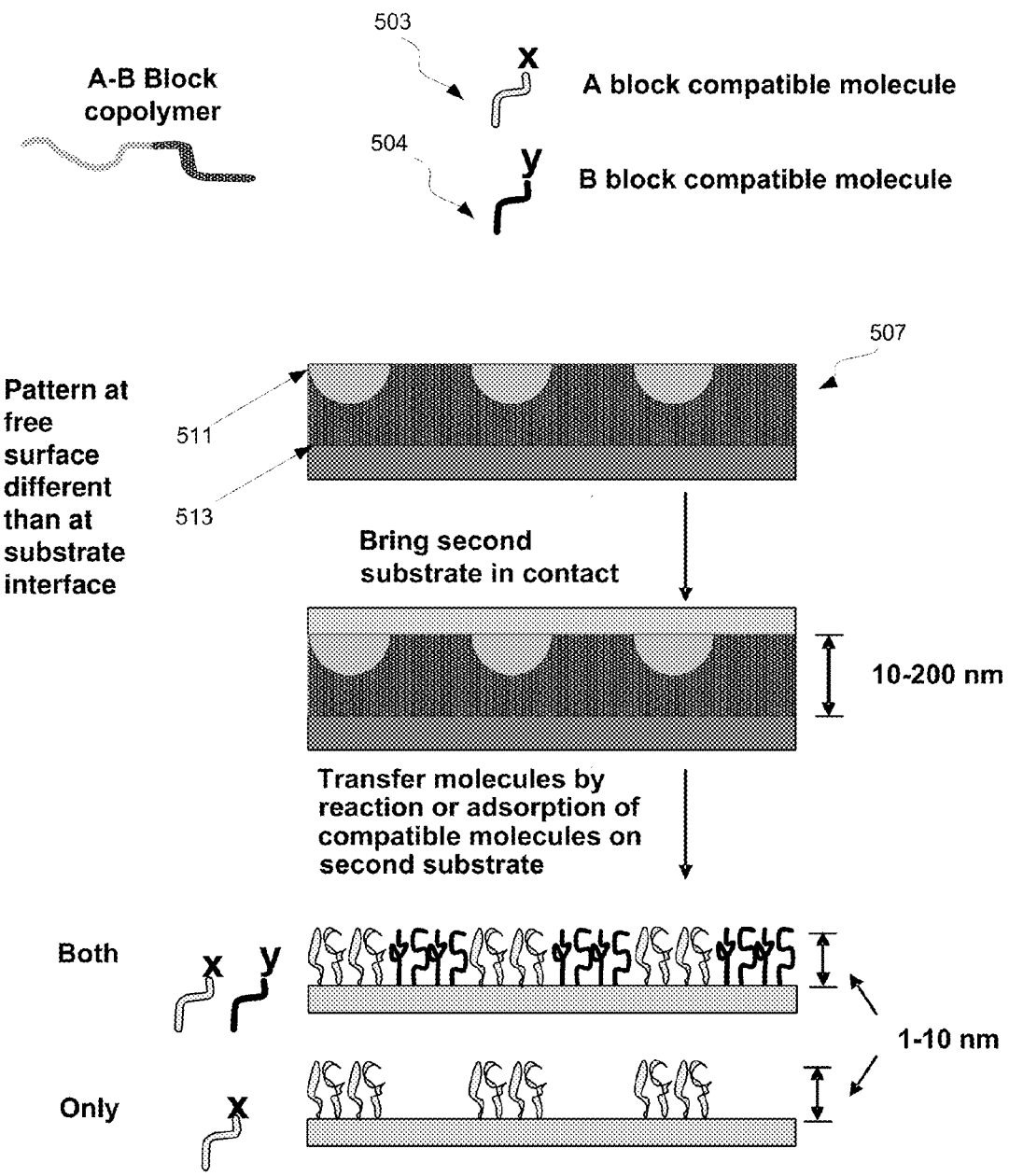

In certain embodiments, the pattern at the free surface, which is transferred to the second substrate, differs from the block copolymer pattern at the interface with the first substrate, depending on the morphology of the copolymer blend. An example is shown in FIG. 5A. Here, as in FIG. 4, a blend including a A-b-B diblock copolymer, a A-preferential ink (503), and a B-preferential ink (504) are formed as a microphase separated thin film 507 on a substrate. In this case, though, the blend exhibits spherical or parallel cylindrical morphology such that the A-rich domains form periodically arrayed spheres or parallel cylinders within a matrix of B-rich component of the blend. The pattern 511 in the blend at the free surface, which is to be transferred to the second substrate, differs from the pattern 513, in this case the substrate is neutral or unpatterned.

Figure 5B:
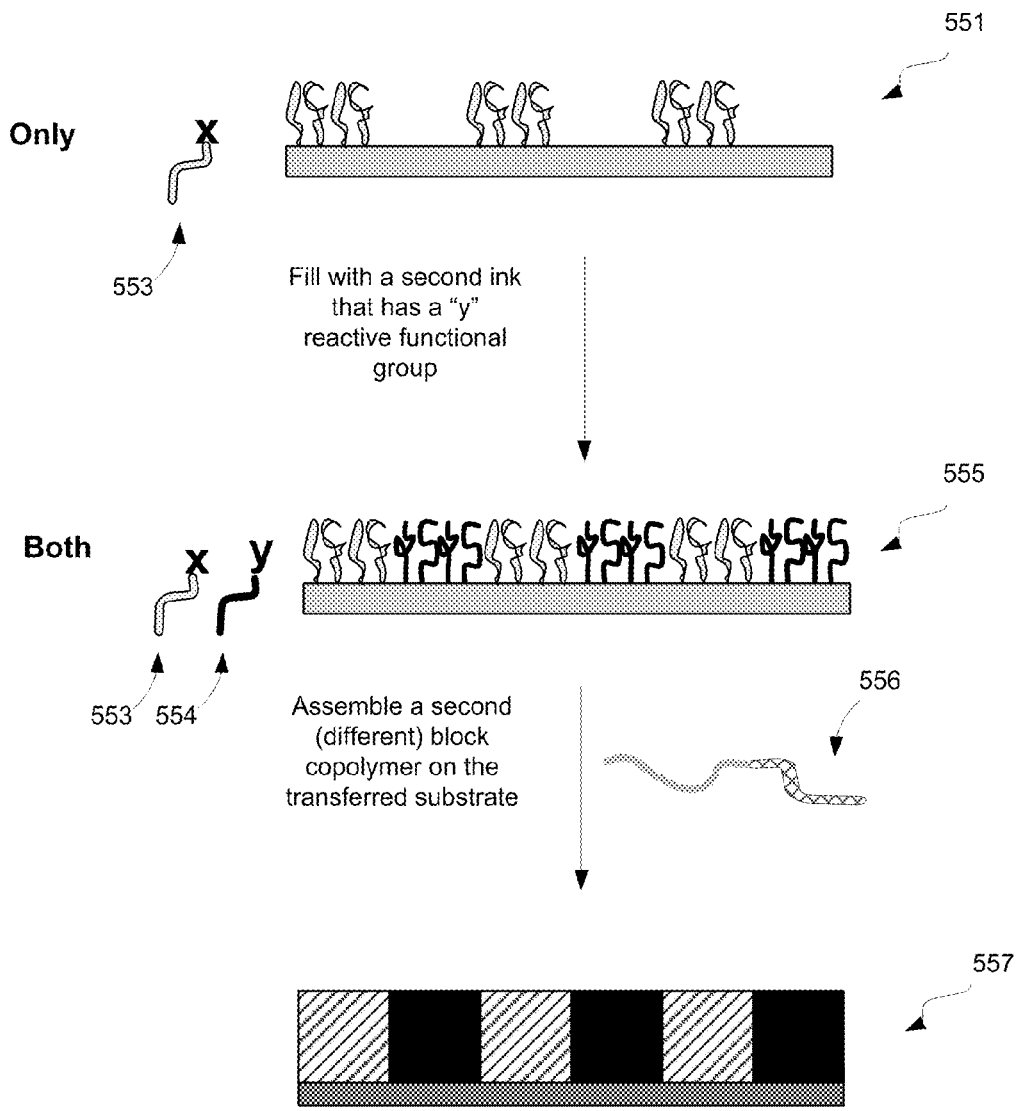

In certain embodiments where ink molecules in only one or a subset of domains of the block copolymer are transferred, the uninked regions of the second substrate are filled with a different functionality, i.e., by attaching molecules having a certain functionality to the uninked regions. An example is shown in FIG. 5B: substrate chemically patterned by molecular transfer printing using an ink molecule 553 having an "x" functionality is shown at 551. The uninked areas are then filled, e.g., by reacting, adsorbing, etc., a molecule 554 having a "y" functionality to form the chemically patterned substrate shown at 555. This pattern may then be used to assemble a microphase separated block copolymer film 557 from block copolymer 556. In the example shown in FIG. 5B, the block copolymer 556 and the resulting block copolymer film are different from those used in the molecular transfer printing process used to form the chemically pattern substrate shown at 551. One or more domains of the film 557 may be inked for further molecular transfer printing or the film may be uninked. In one example, a PS-b-PMMA/PS-OH blend is assembled and the PS transferred via molecular transfer printing to a second substrate (551). The uninked regions are filled with hydroxyl terminated poly(2-vinylpyridine) or P2VP-OH (555), with PS-b-P2VP then assembled on the replica of the original chemically patterned substrate (557).

In another example, a PS-b-PMMA/PS-OH blend is assembled and the PS transferred via molecular transfer printing to a second substrate. The uninked regions are filled with PDMS-OH brushes, e.g., by spin-coating PDMS and removing the excess material such that replica is patterned with PS-OH and PDMS-OH brushes. PS-OH is then removed, e.g., by oxygen plasma, and the PDMS-OH may serve as a hard mask for pattern transfer.

Figure 6:
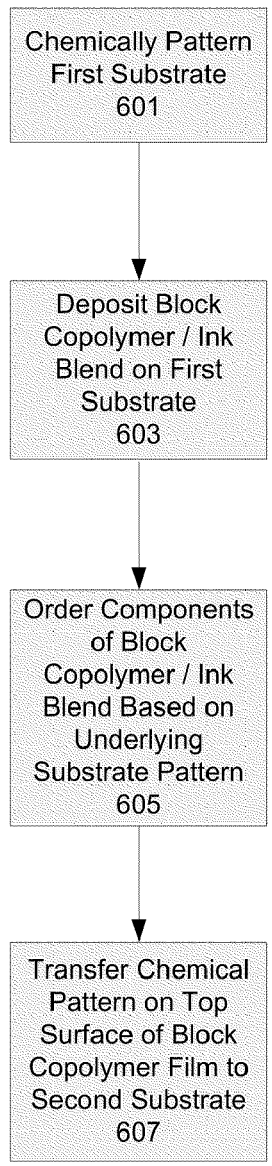
FIG. 6 is a flow diagram showing operations in a method of molecular transfer printing according to certain embodiments.

In certain embodiments, the molecular transfer methods described above include directing the assembly of block copolymers. Directed assembly of block copolymers involves depositing a block copolymer material on a chemically or otherwise patterned substrate and ordering the components of the material in accordance with the underlying pattern. The block copolymer self assembles into distinct domains with the chemical pattern directing the self-assembly. FIG. 6 is a process flow diagram illustrating operations according to certain embodiments. The process begins by creating a chemical pattern on a substrate (601). Any appropriate method of patterning a substrate may be used, with examples including x-ray lithography, extreme ultraviolet (EUV) lithography or electron beam lithography. The block copolymer blend is then deposited on the substrate (603), and ordered in accordance with the underlying substrate (605). To induce ordering, the block copolymer material is typically annealed above the glass transition temperature of the blocks of the copolymer material. By appropriately choosing the first substrate pattern, the block copolymer material and ordering conditions, the block copolymer film may be directed to assemble into periodic, aperiodic or non-regular features, or almost any desired architecture, on the first substrate. The pattern at the free surface of the film is then transferred to a second substrate (607). In certain embodiments, operations 605 and 607 are performed in a single heating operation.

Using the molecular transfer methods described in FIG. 1 with directed assembly is an especially powerful approach because methods of directed assembly can be manipulated to produce block copolymer films having almost any nanoscale pattern at the free surface, including periodic and aperiodic patterns and patterns having irregular features. Also, as discussed further below, under certain circumstances the assembled film exhibits 1) improved pattern quality over the lithographic template with respect to line width roughness and control over features dimensions, 2) resolution enhancement over the lithographic template, and/or 3) more complicated geometry at the surface of the assembled film than the lithographic template. The methods provide a simple to implement way to print a pattern that is more complex and/or has superior resolution than the original lithographic template, allowing pattern transfer of nanoscale patterns that are impossible, impractical or prohibitively expensive to produce using conventional lithographic techniques.

Figure 7A:
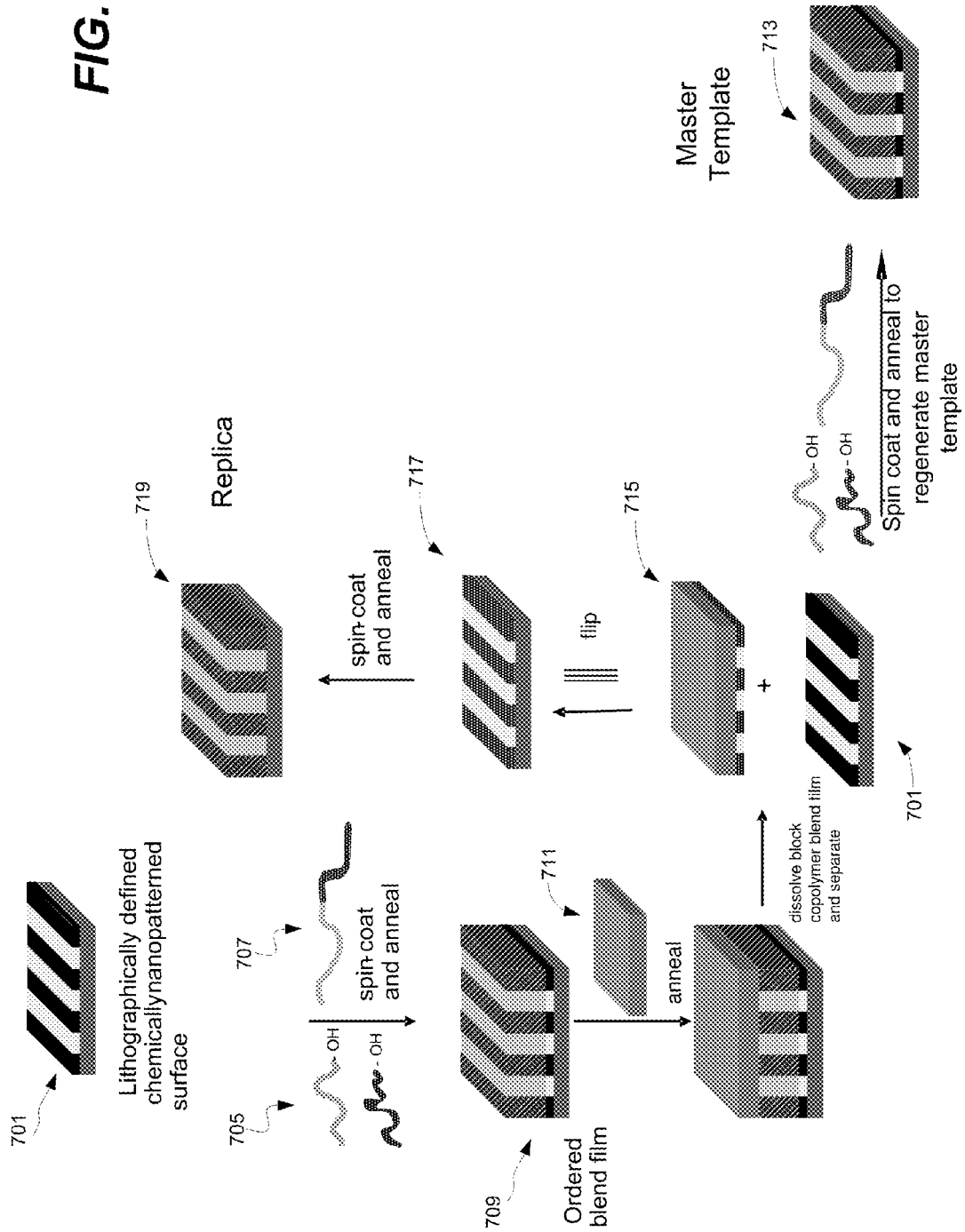
FIG. 7a is a schematic diagram showing operations in a method of creating replicas from a master template according to certain embodiments.

The transferred chemical pattern can in turn direct the assembly of another block copolymer film, and the master can be reused. FIG. 7a is a schematic diagram showing amplification of a master template via the molecular transfer printing method. A lithographically defined chemically nanopatterned substrate having a striped patterned is shown at 701. Block copolymer material 707 and inks 705 are spun onto the substrate and annealed to form an ordered blended film 709. This ordered blended film is the master template. (Lithographic template 701 may also be thought of as a master template, for the purposes of discussion herein however, the ordered blend film on the lithographic substrate is referred to as the master template). A substrate 711 is then brought into contact with the free surface of the ordered blend film so that the ink molecules 705 are transferred to the substrate. After the transfer, the blend film is dissolved and the two substrates are separated, leaving the lithographically defined chemically patterned substrate 701 and newly patterned substrate 715. Block copolymer material and inks or just block copolymer or block copolymer diluent blend are again spun onto the substrate 709 and annealed to form regenerated master template 713. The chemical pattern remains durable and so can be reused numerous times to regenerate the master template. In other embodiments, the block copolymer film remains intact during the separation process, without need for regeneration. The newly patterned substrate is shown flipped at 717. Block copolymer and inks (not shown) are spun and annealed to form a replica 719 of the master template. Note that this method of replicating a master template is not limited to films formed by directed assembly, but may be used with blended block copolymer films formed by any method.

FIGS. 3-6 above describe methods of molecular transfer printing of chemical nanopatterns using block copolymers, as well as using blend films as templates for replicas. Further details of the molecular transfer methods are given below.

2. Forming the Blend Film

Figure 7B:
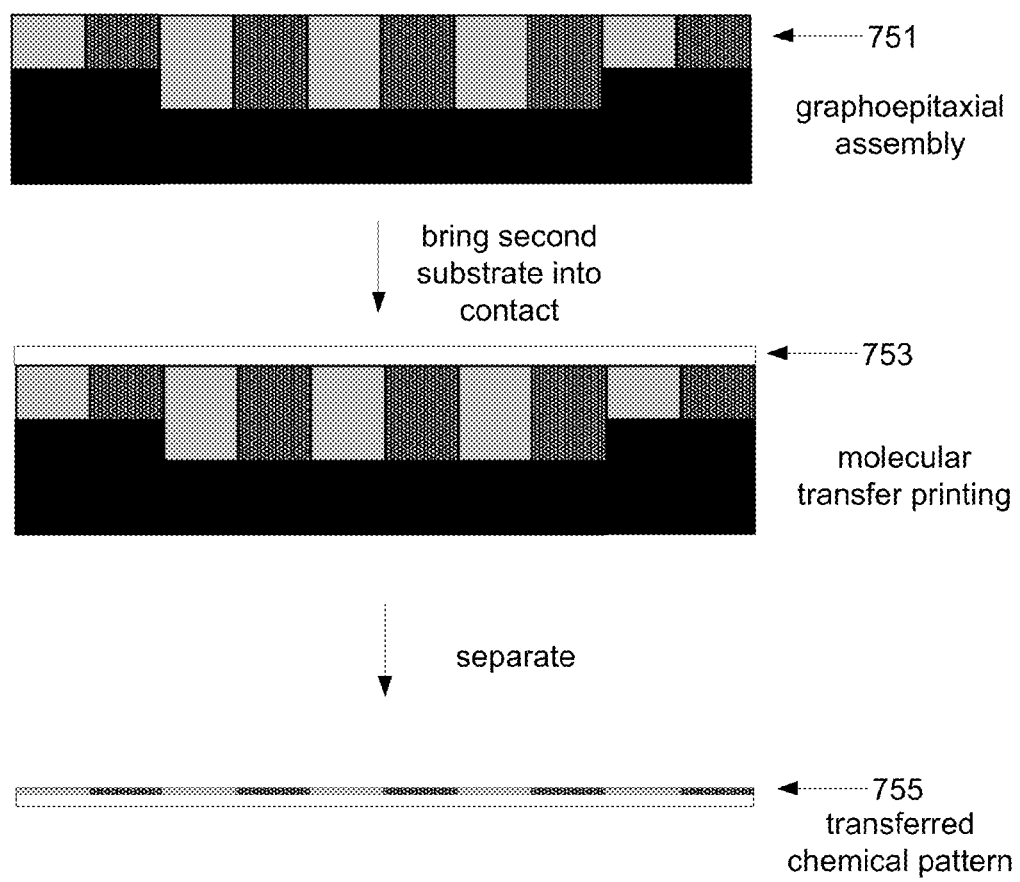
FIG. 7b is a schematic diagram showing operations in a method of molecular transfer printing using graphoepitaxial assembly of the block copolymer film.

While the below discussion refers chiefly to directed assembly of block copolymer materials on chemically nanopatterned surfaces, other methods may be used as well—for example, microphase separated block copolymer films can be formed by depositing block copolymer films and annealing the films so that they self-assemble into different domains. Graphoepitaxy may be used to form thin films of periodic arrays of cylinders, spheres and other features having long range order. FIG. 7b, for example, shows a schematic diagram in which a graphoepitaxially assembled block copolymer/ink blend film 751 (i.e., the underlying substrate uses artificial relief structure to induce order in the block copolymer film). A second substrate 753 is brought into contact with the free surface of the blend film and to transfer the chemical pattern via molecular transfer printing. The chemically transferred pattern 755 is depicted on the second substrate after separation.

The molecular transfer printing methods described herein are powerful when combined with the directed assembly of block copolymer materials. A master chemical or topographic pattern, for example, can be created using advanced lithographic tools. The blend of block copolymer and ink(s) can then be directed to assemble into periodic, non-regular, or integrated circuit regular fabric architectures on the lithographically defined templates. This pattern at the surface of the assembled film, often of higher quality that the original chemically patterned surface, or at higher resolution can then be replicated by MTP on the surface of another substrate. Because the domain sizes of block copolymers can be as small as 2-3 nm, the MTP techniques of the invention provide methods of creating and replicating dense chemical patterns at the highest resolution possible, and at least an order of magnitude smaller than can be achieved using existing technology including various forms of soft lithography, for example, micro contact printing.

As described above, directed assembly of block copolymer films involves depositing the block copolymer material on a chemically (or otherwise activated) patterned substrate. The approach may be used to achieve near perfect or perfect duplication of the underlying pattern in the copolymer film. Directed assembly of patterns having spatial arrangements commensurate with the characteristic dimensions of the domain structure of the block co-polymer (e.g, using a pattern of hexagonally arrayed spheres to direct the assembly of block copolymers having perpendicular cylindrical or spherical domain structures or a pattern of stripes to direct the assembly of block copolymers that exhibit lamellar morphology) is described in U.S. Pat. No. 6,746,825, incorporated herein in its entirety and for all purposes. Directed assembly of patterns containing irregular, isolated or discrete features is described in U.S. Patent Publication No. 2006/0134556, titled "Methods and compositions for forming aperiodic patterned copolymer films," by Nealey et al. and U.S. application Ser. No. 11/879,758, filed Jul. 17, 2007 and titled "Methods and compositions for forming patterns with isolated or discrete features using block copolymer materials," by Nealey et al., both which are incorporated herein by reference in their entireties and for all purposes. For example, integrated circuit layouts may be patterned using features such as lines, t-junctions, bends, spots and jogs. Using the methods described in the above-reference patent application, almost any desired pattern formed by lithographically nanopatterning the initial substrate can be replicated in the block copolymer layer. The pattern can then be transferred to a second substrate as described above with reference to FIGS. 3-7a.

Figure 8:
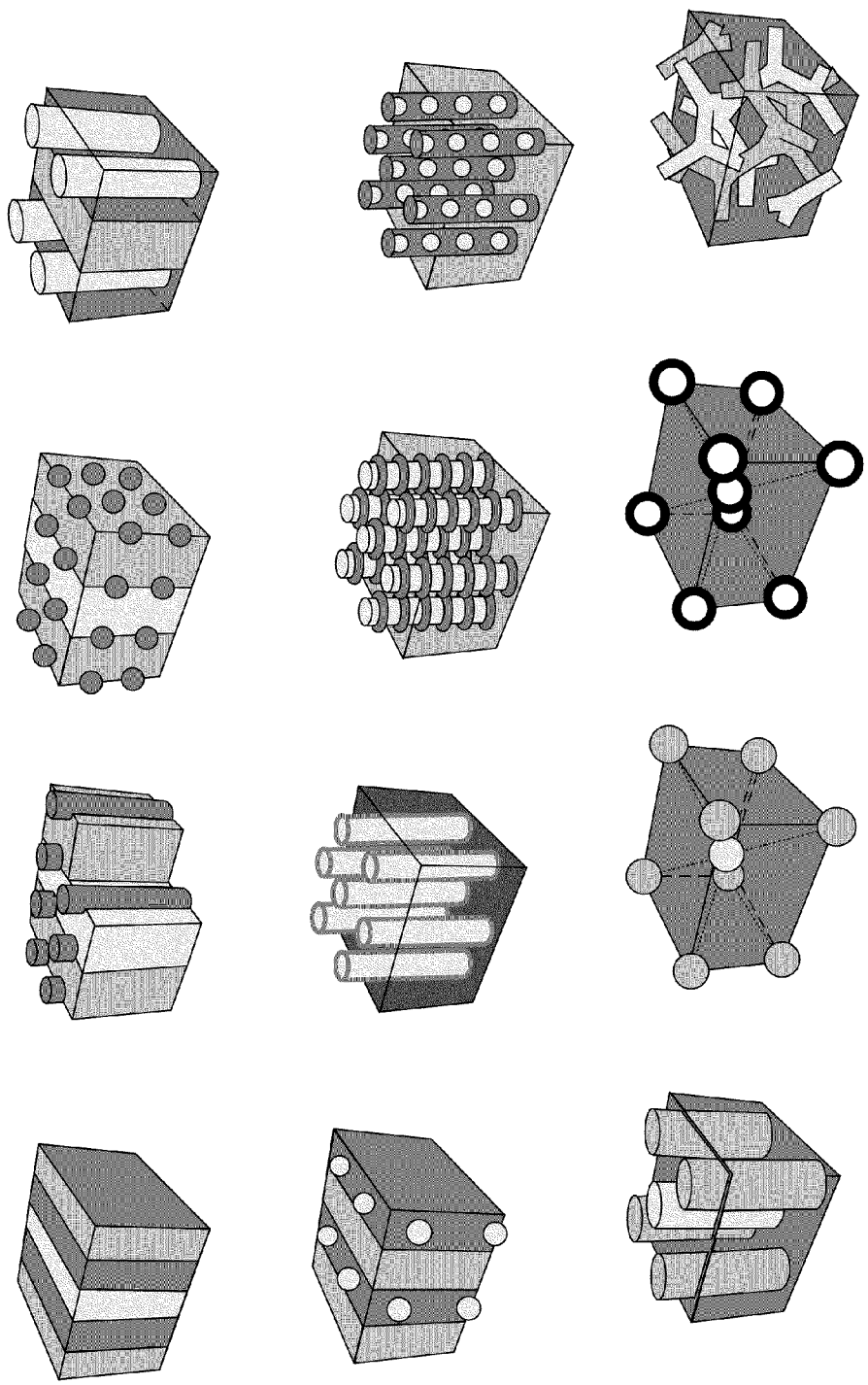
FIG. 8 shows examples of triblock copolymer structures that may be formed using activated two-dimensional templates.

Transferring patterns at the free surface of block copolymer films formed using directed assembly is also powerful for some applications because tightly controlled patterns at the free surface of the film that are more complex or otherwise differ from initial lithographic pattern may be formed by manipulating the block copolymer material, initial chemical pattern and directed assembly process conditions. For example, binary two-dimensional surface patterns can be used to drive assembly of three-component and three-dimensional structures throughout the thickness of the film. FIGS. 8a-c shows examples of complex three-component block copolymer structures that may be formed from directed assembly of a material containing a triblock A-b-B-b-C copolymer on a binary pattern (each shade represents a different domain of the block copolymer material). Using the methods of the invention, all or a subset of the A, B and C may contain a separate ink. For certain of the structures, the pattern varies as the thickness of the film increases; in these cases, the pattern to be transferred is controlled by controlling the thickness of the film. Directed assembly of complex three-dimensional structures, including the structures such as those shown in FIG. 8, as well as structures exhibiting morphologies of multiple continuous domains in discussed in U.S. patent application Ser. No. 11/545,060, filed Oct. 5, 2006 and titled "Directed assembly of triblock copolymers," by Nealey et al., which is incorporated herein by reference in its entirety and for all purposes. U.S. patent application Ser. No. 11/580,694, filed Oct. 12, 2006, titled "Fabrication of complex three-dimensional structures based on directed assembly of self-assembling materials on activated two-dimensional templates," by Nealey et al., incorporated by reference herein in its entirety for all purposes, also discusses forming complex three-dimensional thin film block copolymer structures. As with the example shown in FIG. 5, the pattern at the lithographic template/block copolymer film interface may be different than the pattern at the free surface. Because less complex and/or easy to form chemical patterns may be used to direct assembly of more complex patterns at the surface of block copolymer films, in certain embodiments an expensive lithographic method such as electron beam lithography may be used a single time to form a lithographic template that can be used to drive the assembly of a more complex transferable pattern.

In certain embodiments, the assembled blend film exhibits improved pattern quality with respect to line width roughness and control over features dimensions, and/or resolution enhancement. Block copolymer films having improved line width roughness and/or critical dimension and/or resolution enhancement over the chemically nanopatterned surface are described in Edwards et al., *Dimensions and Shapes of Block Copolymer Domains Assembled on Lithographically Defined Chemically Patterned Substrates*, Macromolecules 2007, 40, 90-96; Daoulas et al., *Directed Copolymer Assembly on Chemical Substrate Patterns: A Phenomenological and Single-Chain-in-Mean-Field Simulations Study of the Influence of Roughness in the Substrate Pattern*, Langmuir, 24, 1284-1295; Edwards et al., *Precise Control over Molecular Dimensions of Block-Copolymer Domains Using the Interfacial Energy of Chemically Nanopatterned Substrates*, Advanced Materials 2004, 16, No. 15, 1315-1319, U.S. Provisional Patent Application No. 61/005,721, filed Dec. 7, 2007, titled "Methods To Enhance And Augment The Patterning Capabilities Of Lithographic Materials And Processes Using Block Copolymers," and U.S. Provisional Patent Application No. 61/068,912, filed Mar. 10, 2008, titled "Patterning Beyond The Limits Of Lithographic Resolution," all of which are incorporated herein by reference in their entireties. Because the pattern at the top of the film is better than the pattern on the lithographically patterned substrate (or other chemical pattern that is used to drive the assembly of the block copolymer film), the pattern transferred to the second substrate is improved over the original lithographically patterned substrate. By repeating the molecular printing operations with each successively transferred pattern used as a template for the next generation, pattern quality improves with each generation. Pattern quality may also improve by improving the chemical contrast of the pattern from generation. For example, a chemical pattern may have relatively poor chemical contrast, but is able to direct assembly of a block copolymer film. The assembled block copolymer film may then be used to transfer inks that are have high chemical contrast, creating a pattern that has improved chemical contrast over the original chemical pattern.

Density multiplication techniques such as described in the above-referenced U.S. Provisional Patent Application No. 61/068,912, may also be used in accordance with the molecular transfer printing methods described herein. For example, using these techniques, a lithographically patterned substrate having dots spaced 64 nm apart may be used to direct assembly of a block copolymer film having dots spaced 16 nm apart. The pattern at the block copolymer film surface may be transferred via molecular transfer printing to another substrate, which is then used to direct assembly of a film having dots spaced 4 nm apart. Molecular transfer printing is then used to transfer the pattern to a second surface. The result is a high pattern density chemically patterned substrate generated from a single lithographically patterned substrate that was patterned at a relatively low pattern density.

A. Block Copolymers

Any type of copolymer that undergoes microphase separation under appropriate thermodynamic conditions may be used. This includes block copolymers that have as components glassy polymers such as PS and PMMA, which have relatively high glass transition temperatures, as well as more elastomeric polymers, e.g., polyisoprene (PI), polybutadiene (PB), and poly(dimethylsiloxane) (PDMS) that allow room temperature processing.

In addition to one or more inks, the block copolymer material may further comprise one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol). Either as, or in addition to one or more inks, the block copolymer material may also further comprise one or more homopolymers. In some embodiments, the material may be a block copolymer/homopolymer blend.

The block copolymer material may also further comprise one or more homopolymers. In some embodiments, the material may be a block copolymer/homopolymer blend. In a preferred embodiment, the block copolymer material is a block copolymer/homopolymer/homopolymer blend. In a particularly preferred embodiment, the material is a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

The thickness of the deposited block copolymer film typically is between ones of nanometers to 200 nm, although films of thickness up to about 1 micrometer may be used in some instances. In particular embodiments, the film thickness is between about 20-200, or more particularly between about 30-100 nm.

Figure 7C:
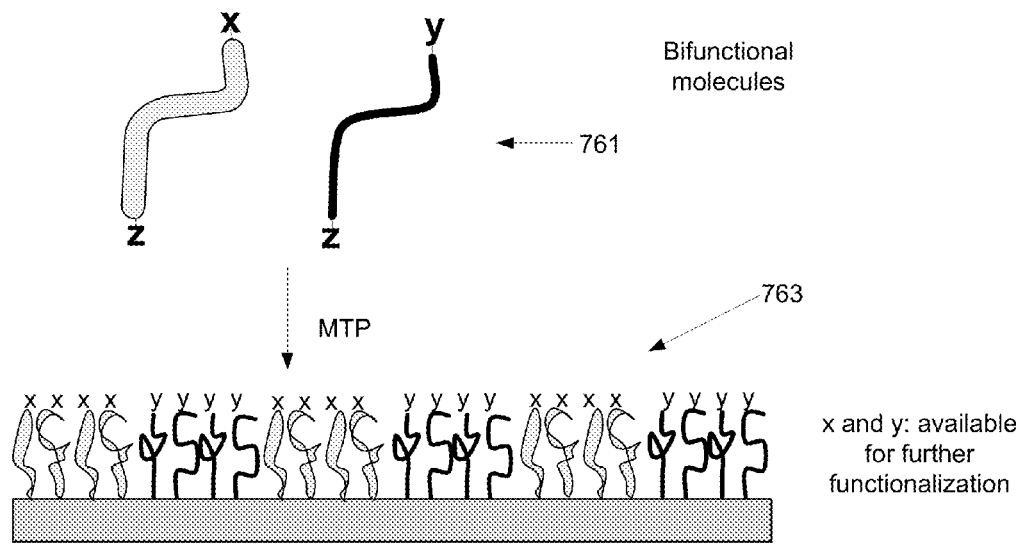
FIG. 7c is a schematic diagram illustrating use of bifunctional ink molecules in a molecular transfer printing process according to certain embodiments.
Figure 7D:
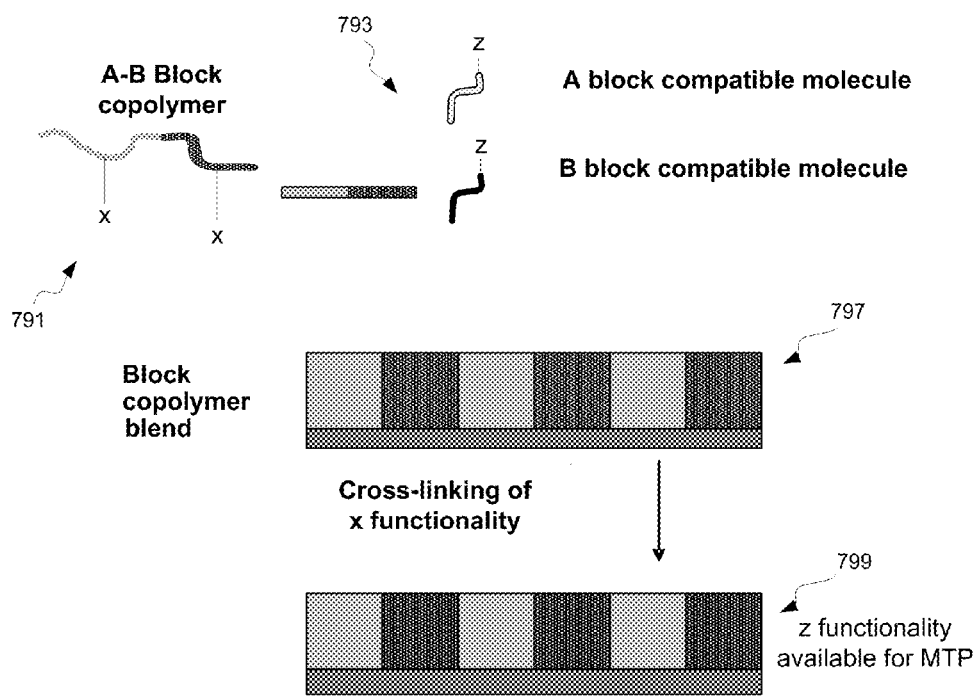
FIG. 7d is a schematic diagram illustrating use of copolymer cross-linking molecules in a molecular transfer printing process according to certain embodiments.

In certain embodiments, the block copolymer film may be cross-linked for greater structural integrity. Cross-linking the block copolymer film typically occurs after self-assembly and prior to separation of the block copolymer film, usually prior to the contact with the second substrate. FIG. 7d shows a schematic of an A-B block copolymer 791. Each of the blocks has one or multiple "x" groups, which has crosslinkable functionality. Inks 793 have "z" groups, to interact with the second substrate in the printing process. The block copolymer blend film 797 undergoes a cross-linking process that cross-links each block of the block polymers within each domain to produce blend film 799. The "z" groups are available for molecular transfer printing as described further below. In certain embodiments, cross-linking allows the first substrate/block copolymer/second substrate sandwich structure to be exposed to solvent, physical force, etc. to be separated without destroying the block copolymer film. In this manner, an assembled block copolymer film may be re-used to print its pattern numerous times.

According to various embodiments, materials that may be used in molecular transfer printing methods described herein are not limited to block copolymer materials, but may be performed with any material that can undergo separation into different domains, in which one or more inks may be sequestered. In certain embodiments, this is material that undergoes phase separation or is otherwise separated or separable. In certain embodiments, non-block copolymer polymer blends may be used. In other embodiments, polymer blends that contain block copolymers that are not micro-phase separated may be used. For example, a polymer blend that is separated into domains may incorporate block copolymers to reduce the size of the domains. According to various embodiments, the domains may be on the order of nanometers—micrometers or larger.

B. Inks

An ink, or a transfer molecule or composition, is a molecule or composition that is transferred from the block copolymer blend film to a second substrate in accordance with the pattern exhibited by the block copolymer film at its free surface. It may also be referred to as a transfer molecule or composition. The molecule or composition is preferentially compatible with or separates into a subset of the blocks or components of the block copolymer film to form the patterned and inked blended film. After self-assembly of the block copolymer material, microphase separation results in inks that are sequestered into domains of nanometer scale dimensions. Typically an ink is compatible with one block of the block copolymer, e.g., compatible with only the PS block of a PS-b-PMMA diblock copolymer. In embodiments triblock (n-block) copolymers, the ink may be compatible with anywhere from one to n−1 blocks of the copolymer material. All or a subset of the copolymer domains may be inked.

The ink molecules are transferred to the second substrate by interaction with the second substrate, e.g., reacting with it, adsorbing on it, absorbing into it, etc. In addition to be preferentially to one of the components of a block copolymer film, an ink molecule is also designed to interact with second substrate. Inks are transferred to the second substrate in the exact pattern of block copolymer domains in which they are present at the surface of the block copolymer film. The differences in chemistry of the blocks of the copolymer that result in micro-phase separation (self-assembly into nanoscale domains) also allow inks to be sequestered into specific blocks and prevent lateral mass transfer during the printing step that might otherwise smear or limit the resolution of the technique.

The inks may be any diluents of the copolymer material that preferentially separate into a subset of the domains of the assembled material. Examples of inks include homopolymers of the components of the block copolymer (e.g., PS-OH as an ink that preferentially separates into the polystyrene domains of a PS-b-PMMA copolymer film).

The inks may be functional molecules, e.g., peptide molecules may be transferred to create peptide patterns on the second substrate. In certain embodiments, it may be desirable to homogenously swell all the components of the block copolymer material with inking only one of block copolymer domains. This can be accomplished, for example, by including a diluent without the reactive group that allows it to be transferred to the second substrate. For example, in FIG. 7a, only one of the molecules indicated at 705 has an —OH reactive group, so that only it would be transferred.

Examples of inks include homopolymers compatible with one block, e.g. poly(phenylene oxide)-OH, which is mixable with PS or P2VP-OH, which the inventors have found stays with PMMA in certain blends. Other inks include any nonvolatile small molecules (e.g., unpolymerized organic molecules) or functionalized nanoparticles preferential to a single or subset of blocks. Homopolymers and oligomers with varying mass transport properties and attachment chemistries, other selectively compatible small molecules, and inks amenable for post-patterning functionalization may all be use in accordance with the methods herein.

In certain embodiments, the inks may be or include dopants, e.g., an integrated circuit pattern may be transferred using a molecule containing boron, phosphorous, gallium, arsenic, etc. In this manner these dopants may be subsequently implanted in a semiconductor substrate.

Bifunctional inks may be used in certain embodiments, with one functionality for attaching to the second substrate and a second function as determined by the eventual application. This is illustrated in FIG. 7c, which shows bifunctional ink molecules 761, one having "x" and "z" functional groups, and one having "y" and "z" functional groups. The "z" functional group is used during the molecular transfer printing process to interact with the transferee substrate, forming chemical pattern 763 on the transferee substrate. The ink molecules retain the "x" or "y" functional groups at their unattached ends. In certain embodiments, these groups are further functionalized. Examples include of "x" or "y" functional groups as well as further functionalization operations include Bromine: Atom Transfer Radical Polymerization (ATRP on surface) to attach a second block on chain end; transformation of bromide to azide or amine functionality, etc.

Nitroxide: nitroxide mediated polymerization to attach a second block

Z—C(=S)—S—R: reversible addition-fragmentation chain transfer (RAFT) polymerization alkene: polymerizable, crosslinkable NHS, carboxylic acid, amine or maleimide: conjugate DNA, biologically relevant molecules or nanoparticles to the pattern In certain embodiments, the "x" and "y" functional groups do not need further functionalization.

In certain embodiments, the inks may be designed to transfer chemical functionality. For example, a poly(tert-butyl acrylate) (PBA$^t$-X) ink molecule (e.g., as part of a PS-b-PBA$_t$/PS-X/PBA$^t$-X ternary blend, with the X group interacting with the second substrate surface) may be transferred to the second substrate, with PBA$^t$ deprotected in the transferred pattern to afford carboxylic acid functionality for modification.

According to various embodiments, an ink may be blended with the block copolymer material prior to or after the material has been provided to a substrate. An ink may also be added to the block copolymer material prior to or after ordering of the block copolymer material. In certain embodiments, one or more inks and block copolymers is added to a homogenous disordered solution of block copolymer, which is then spun on or otherwise transferred to a first substrate. The deposited material is then annealed to induce ordering. Because each ink has preference for one (or a subset) of the component polymers of the block copolymers, when the block copolymers self assemble into different domains, each ink is segregated into domains of the component to which it is preferential. In other embodiments, one or more inks may be added to the block copolymer film after the block copolymer has self-assembled into the different domains. For example, an ink may be preferentially absorbed into the block copolymer film after the block copolymer film assembly.

In certain embodiments, an ink may be integrated into a block copolymer film by substituting the ink molecules for a diluent that it is in the film. So, for example, the block copolymer film may be assembled using a first diluent that is preferential to one of the domains. This diluent may be substituted for the ink molecules. The diluent may also be modified in some way to transform it into the desired transfer molecule.

In certain embodiments, there may be one or more reservoirs each having one or more inks that serve to refresh a block copolymer film with ink. The reservoir may be located so that it contacts the block copolymer film, e.g., within the substrate underlying the block copolymer film, so that the reservoir molecules contact the film and diffuse through the film to reach the surface, each molecule going to the domain to which it is preferential. Ink molecules may also be delivered from the reservoirs to the film using microvalves, microchannels and pumps, capillary forces, gravity, etc. An ink molecule may be directed to its preferred domain or may not need to be due to the chemical preference. According to various embodiments, refilling the block copolymer film may occur from the backside or the free surface of the film.

C. Ordering the Film

Figure 9:
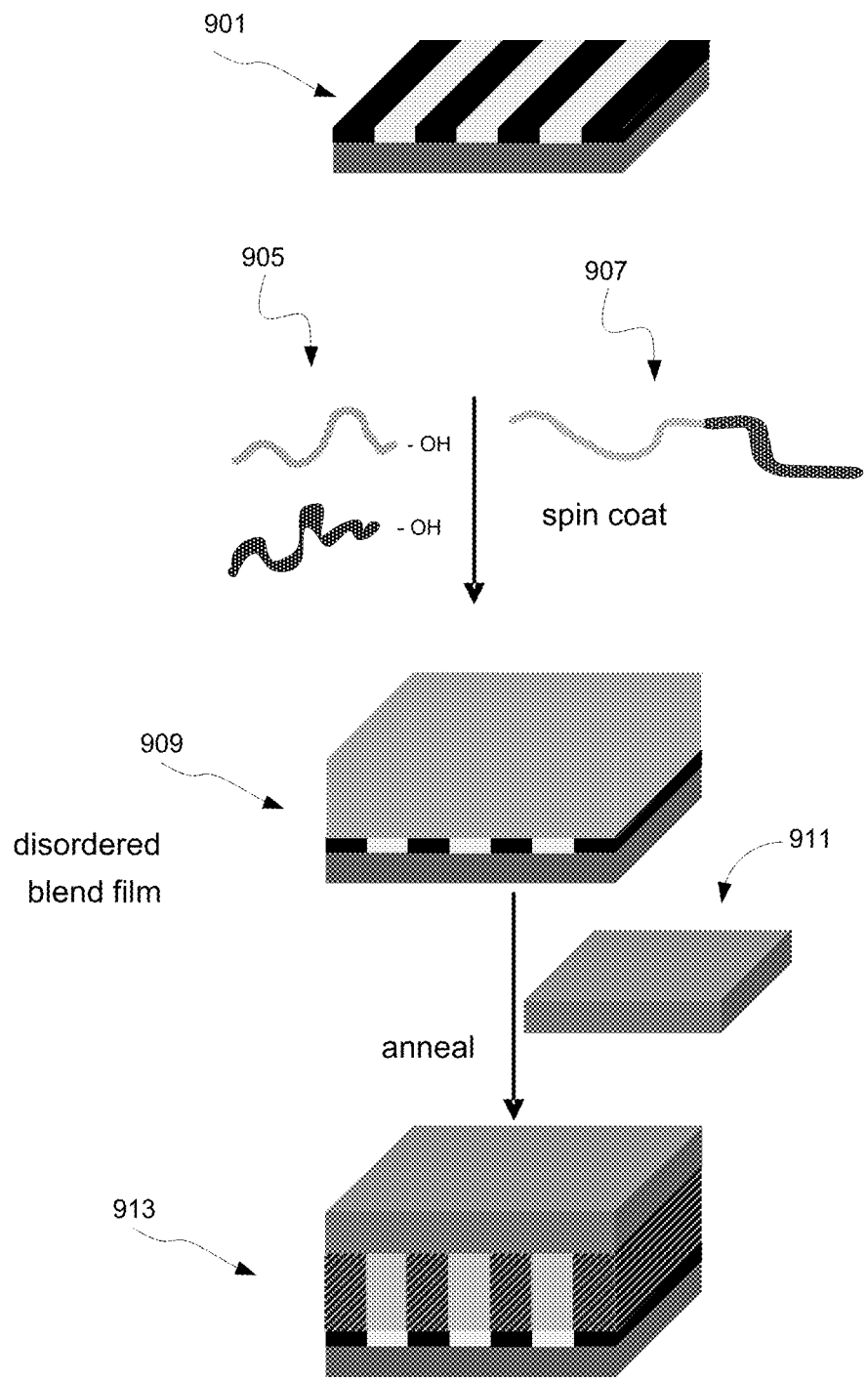
FIG. 9 is a schematic diagram showing operations in a method of molecular transfer printing according to certain embodiments.

As described above, the block copolymer material is induced to self-assemble (either directed or undirected) into domains of different morphological features. Inducing ordering is typically accomplished by annealing it above its glass transition temperature. According to various embodiments, the annealing or other ordering operation may be performed prior to or after the second substrate being brought into contact with the copolymer material. For example, FIG. 7a illustrates operations in which the block copolymer 707 and inks 705 are deposited and annealed to form an ordered blend film 709, prior to contacting the second substrate 711. In other embodiments, the copolymer material may be ordered after the second substrate is brought into contact with the material. This is schematically illustrated in FIG. 9, which shows substrate 901 on which a block copolymer blend film is to be deposited. In the example shown in FIG. 9, the substrate is lithographically patterned to direct the self-assembly of the copolymer film. A solution including ink molecules 905 and copolymer 907 is spun onto the substrate as indicated to form a disordered blend film 909. Substrate 911 is then brought into contact with the disordered blend film 909. An annealing process is performed to order the film, separate the copolymer components into distinct domains and sequester each ink into the domain for which it has an affinity. The ordered blend film in contact with substrate 911 is shown at 913. Depending on the specific materials used, inducing the copolymer material to self-assemble occurs prior to and/or at lower temperatures than required to induce mass transfer of the ink molecules to the second substrate. In situations wherein this is not the case, however, the film is ordered prior to contacting with the second substrate.

3. Molecular Transfer Printing

Once a patterned and blended film is formed, with inks segregated into different domains at the free surface of the blend film, the pattern at the free surface is transferred to a second substrate via mass transfer of ink molecules from the blend film to the second substrate. The pattern geometry that is transferred is controlled by the geometry of the block copolymer film at its free surface.

Figure 10:
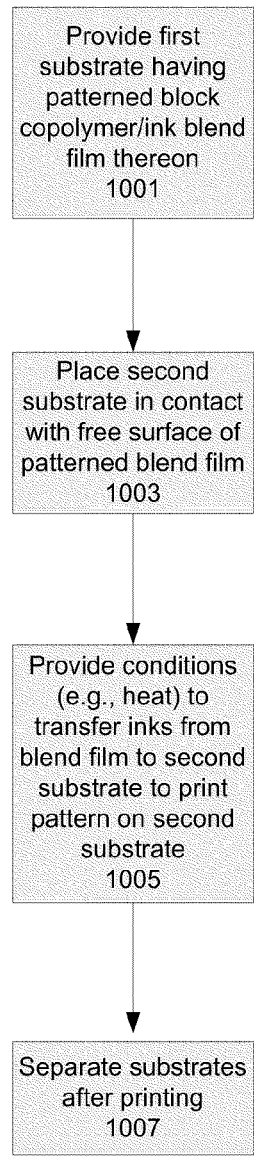
FIG. 10 is a flow diagram showing operations in a method of molecular transfer printing according to certain embodiments.

FIG. 10 is a process flow diagram that depicts operations in method of transferring the ink molecules from the free surface of the blend film to the second substrate. The process begins by providing a substrate having a patterned block copolymer/ink blend film deposited thereon as described above. See block 1001. A second substrate, i.e., the substrate to which the pattern is to be transferred, is then placed into contact with the free surface of the patterned blend film. The two substrates are pressed together or otherwise placed into physical contact (1003). (While typically the blend film and the second substrate physically contact, in certain embodiments, the blend film may be brought into close enough proximity with the second substrate that the transfer molecules are able to be transferred to the second substrate.) Various methods or tools for aligning the substrates may be used so that the pattern is transferred to the desired area on the second substrate. It should be noted also that certain embodiments, as described above with reference to FIG. 9, the second substrate may be brought into contact with the blend film prior to ordering.

In addition to pressing two relatively flat surfaces together, contact between the second substrate and the blend film may be made by roll to roll or roll to substrate processing. For example, a cylindrical substrate may be rolled across a blend film on a flat substrate to transfer the pattern to the cylindrical substrate. Either or both of the substrates may be cylindrical or otherwise curved, so long as physical contact can be made between the blend film and the second or transferee substrate.

The second substrate and ink molecules are tailored such that the molecules adsorb onto, react with or otherwise stick to the surface of the second substrate. In one example, an —OH group on an ink molecule reacts with a silanol group of a silicon oxide substrate, thereby affixing the ink molecule to substrate.

Figure 11A:
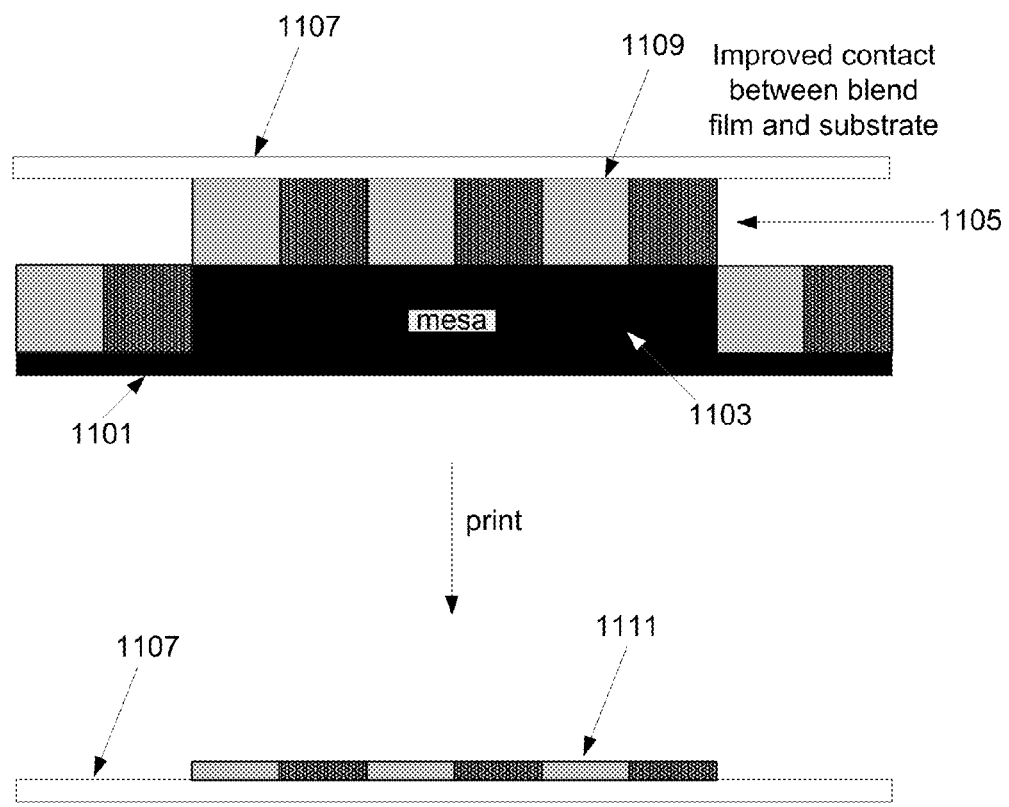
FIG. 11a is a schematic diagram illustrating the use of a topographical feature to improve substrate-blend film contact in a method of molecular transfer printing according to certain embodiments.

In general, the area of pattern that can be transferred in one step depends on planarity and achievable contact area of the blend film with second substrate. In certain embodiments, a raised topographical feature such as a mesa may be used to improve contact of the second substrate and the inked block copolymer film. FIG. 11a depicts a substrate 1101 including mesa 1103. Patterned and inked block copolymer film 1105 is on the substrate 1101, with the portion of the film on the mesa in contact with substrate 1107. The total surface area of the substrate 1107 is larger than that copolymer film of the mesa, providing improved contact at the blend film free surface/substrate interface 1109. As can be seen from the schematic, the film on the lower portions of the substrate 1101 does not contact the substrate 1107. Accordingly the film there may not be present and/or these portions of the substrate may not be patterned. After printing, the transferred pattern 1111 on substrate 1107 is depicted.

In certain embodiments, the second substrate may be brought into contact with the block copolymer blend film via conformal deposition of a material onto the blend film.

Figure 11B:
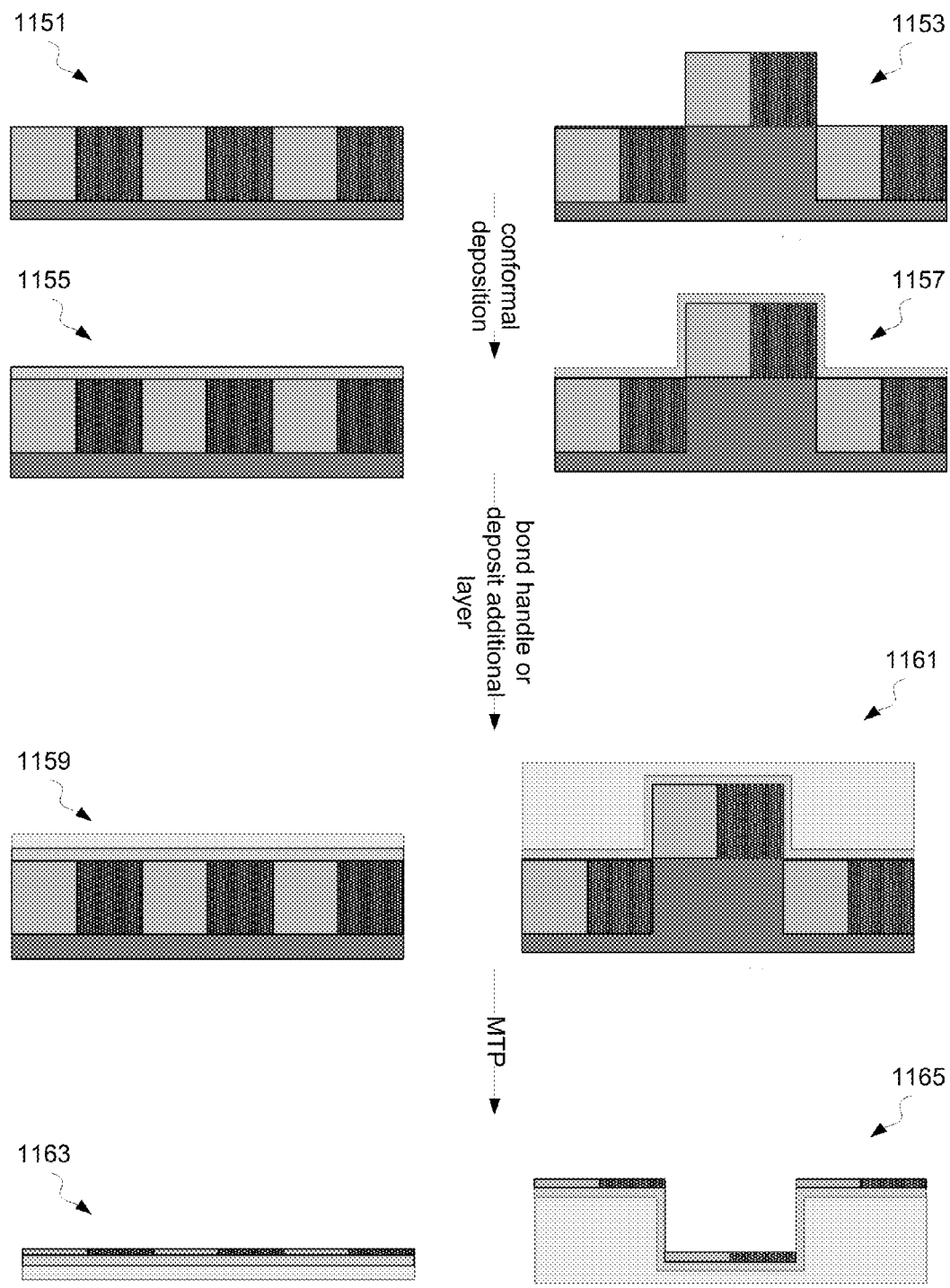
FIG. 11b shows schematic diagrams illustrating use of a conformal deposition of a second substrate material to provide contact with the blend film in a method of molecular transfer printing according to certain embodiments.

FIG. 11b shows schematic depictions of two examples of conformal deposition of a material onto the blend film. Blend films 1151 and 1153 are shown, deposited on a flat substrate and a substrate having a topographical feature, respectively. A transferee substrate material, shown at 1155 and 1157, is then conformally deposited on blend film 1151 and 1153, respectively. Conformal deposition may take place by any know conformal deposition method including chemical vapor deposition, atomic layer deposition, physical vapor deposition and spin on methods. Specific examples include conformal deposition of silicon oxide, e.g., via evaporation of a silicon-containing precursor, or spin coating a silsesquioxane oligomer on the surface to create conformal contact. Any material that may be conformally deposited may be used. If necessary, the material conformally may then be bond handled for additional strength, or otherwise processed. For example another layer may then be deposited on the conformally deposited material. This is illustrated at 1159 and 1161. In certain embodiments, the silicon oxide layer, silsesquioxane layer, or other layer is thermally cured prior to or during the printing process to form the top layer of second substrate. The ink molecules of the blend film are then transferred in the printing process, e.g., by reaction or adsorption of compatible molecules on the second substrate as discussed further below. The transferred chemical patterns are shown at 1163 and 1165. In certain embodiments, the chemical pattern may also be transferred to the sidewalls of the recessed feature shown at 1165.

Returning to FIG. 10, once the patterned blend film is in contact with the second substrate, conditions that allow the transfer of the ink or transfer molecules from the blend film to the substrate are provided. See block 1005. In many embodiments, this involves an applying thermal or some other form of energy (UV, etc.) to the material. For example, this may be the activation energy for the reaction of the transfer molecules with the surface of the second substrate, the adsorption of the molecules onto the second substrate, or interaction with the transfer molecules and the second substrate. In this manner, the pattern at the free surface of the blend film is printed on the second substrate. The differences in chemistry of the blocks of the copolymer that result in microphase-separation (self-assembly into nanoscale domains) and sequestering of inks into particular nanoscale domains also prevent lateral mass transfer during this printing step that might otherwise smear or limit the resolution of this technique.

The MTP temperature depends on the temperature at which the inks have enough mobility for mass transfer to occur on reasonable time frame. For homopolymers, this is above their glass transition temperature $T_g$. In certain embodiments, transfer temperatures ranging from about the glass transition temperatures to the thermal decomposition temperature of the components blocks of the block copolymer are used. Small molecules may transfer below glass transition temperatures of the copolymer.

In certain embodiments, block copolymers blends having a physical and/or chemical crosslinking within domains are used. For example, in one embodiment, to transfer PMMA-OH and PS-OH inks from a PS-b-PMMA/PS-OH/PMMA-OH blend, temperatures ranging from 120° C.-280° C. are used. In certain embodiments, room temperature processing may be used by using elastomeric polymers. In these embodiments, the printing process may involve only physically contacting the free surface of the blend with the second substrate.

As indicated the chemical pattern that is transferred is defined by the pattern of the block copolymer domains at the surface of the blend film. In certain embodiments, the chemical pattern transferred is a replica of the chemical pattern defined the nanoscale domains of the block copolymer film at the surface of the film. In alternative embodiments, the transferred pattern is still defined by the pattern at the surface of the film, but is not a replica, e.g., if two of the components of a triblock copolymer that forms a ternary pattern at the blend film surface have the same ink or are not inked, a binary pattern may be transferred.

As described below, the critical dimension (width) of the pattern features is limited only by the size of block copolymer domains, as so may be as small as ones of nanometers and as high as 100-200 nm. The height of the transferred chemical pattern features is determined by the size and characteristics of the ink molecules. An example of a typical range of heights is 1-10 nm.

Once the printing step is complete, the substrates are separated. See block 1007. Separation techniques include exposure to a solvent, sonication, mechanical force, etc., or any combination of these. Depending on the separation technique, the integrity of the block polymer film may be maintained or not. For example, referring back to the example depicted in FIG. 7, once the printing step is complete, the block copolymer film is dissolved and washed away, in this example leaving the original lithographically patterned substrate 709. The original lithographic substrate may be used again as depicted in the figure.

In certain embodiments, the block copolymer film is cross-linked so that it does not dissolve during the separation operation, and so may be re-used. A master template, for example, may be used to generate numerous replicas without having to undergo the regeneration process depicted in FIG. 7. In embodiments in which the block copolymer film is not dissolved, it may be necessary to replenish the block copolymer film with fresh ink molecules. This may be done by a deposition, infiltration, absorption, or other process or there may be a reservoir of ink molecules that feeds the molecules to the block copolymer film. In embodiments in which the block copolymer domains are not refilled with ink, a film may be able to be re-used multiple times before running dry.

The mode of separation may also vary with the composition of the substrate to which the pattern is transferred. For example, a flexible film such as an elastomeric film may be peeled off the block copolymer film after the chemical pattern has been transferred to the flexible film.

EXAMPLES

The following examples provide details illustrating aspects of the present invention. These examples are provided to exemplify and more clearly illustrate these aspects of the invention and are in no way intended to be limiting.

Experimental Procedure

Examples 1-3

The following experimental procedure was used to transfer chemical patterns to Si wafers in the some of the below examples:

Block copolymer: PS-b-PMMA

Inks: PS-OH (preferentially to PS domains) and PMMA-OH (preferential to PMMA domains)

Forming blend film on neutral or chemically nanopatterned first substrate: Spin-coat 1.5% PS-b-PMMA (52K-52K) with PS-OH (6K, 5% relative to PS-b-PMMA) and PMMA-OH (6K, 5% relative to PS-b-PMMA); Anneal at 190° C. for 1 day (or 230° C. for 3 min) or w/o annealing Transferring pattern: cover first substrate with Si wafer, and anneal at 160° C. for 2 days (or varying annealing conditions)

Separating substrates: sonicate in toluene to separate wafers and remove unbound polymers Using transferred pattern to direct assembly of block copolymer film: Spin-coat PS-b-PMMA (or blend) on the top cover wafer and anneal at 230° C. for 3 min or 190° C. for 1 day.

Example 1

A master template was formed from the directed assembly of the block copolymer film on a lithographically defined chemically nanopatterned substrate using the experimental procedure outline above. The period of the parallel alternating poly(styrene) (PS) and poly(methylmethacrylate) (PMMA) lamellar domains was 47.5 nm. The pattern was transferred to a second substrate. The transferred pattern was then used to direct the assembly of a block copolymer film to form a replica and the master template was regenerated using a process as described with reference to FIG. 7*a*. The process repeated 20 times to produce 20 replicas and regenerate the master template 20 times.

Figure 12:
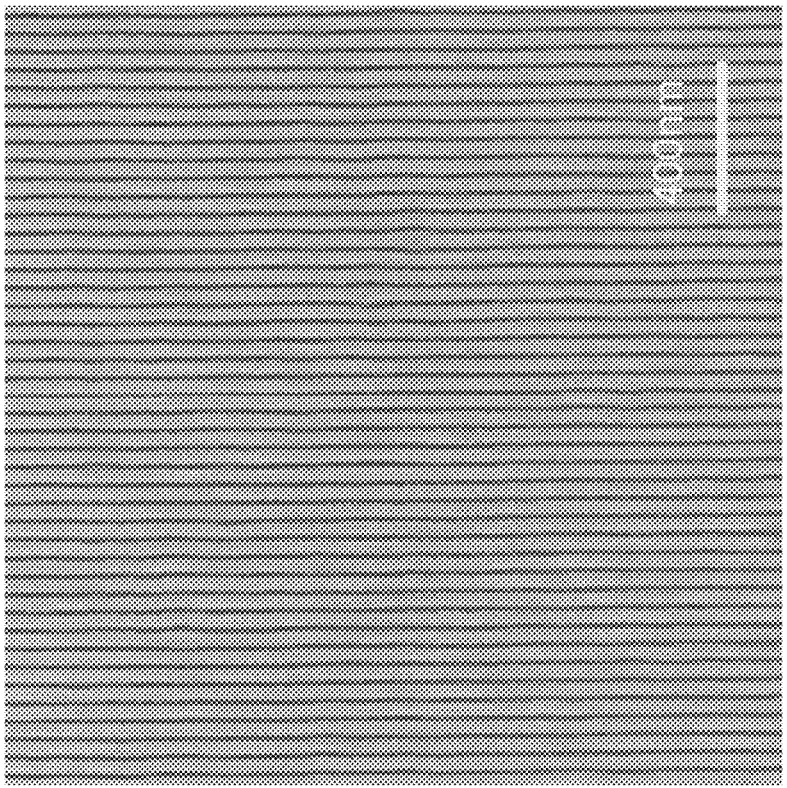
Figure 12:
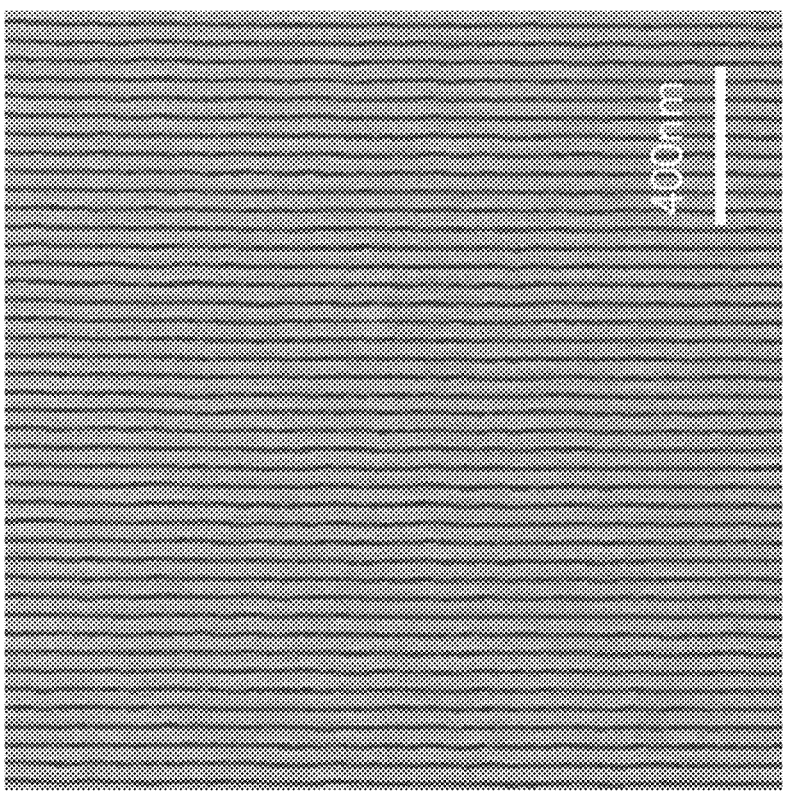

FIG. 12 shows SEM images of the master template regenerated after the $1^{st}$ cycle, and that regenerated after the $20^{th}$ cycle. No substantial differences were observed between the quality of the master templates from cycle to cycle, showing that the original lithographically defined chemical pattern is durable.

Figure 13:
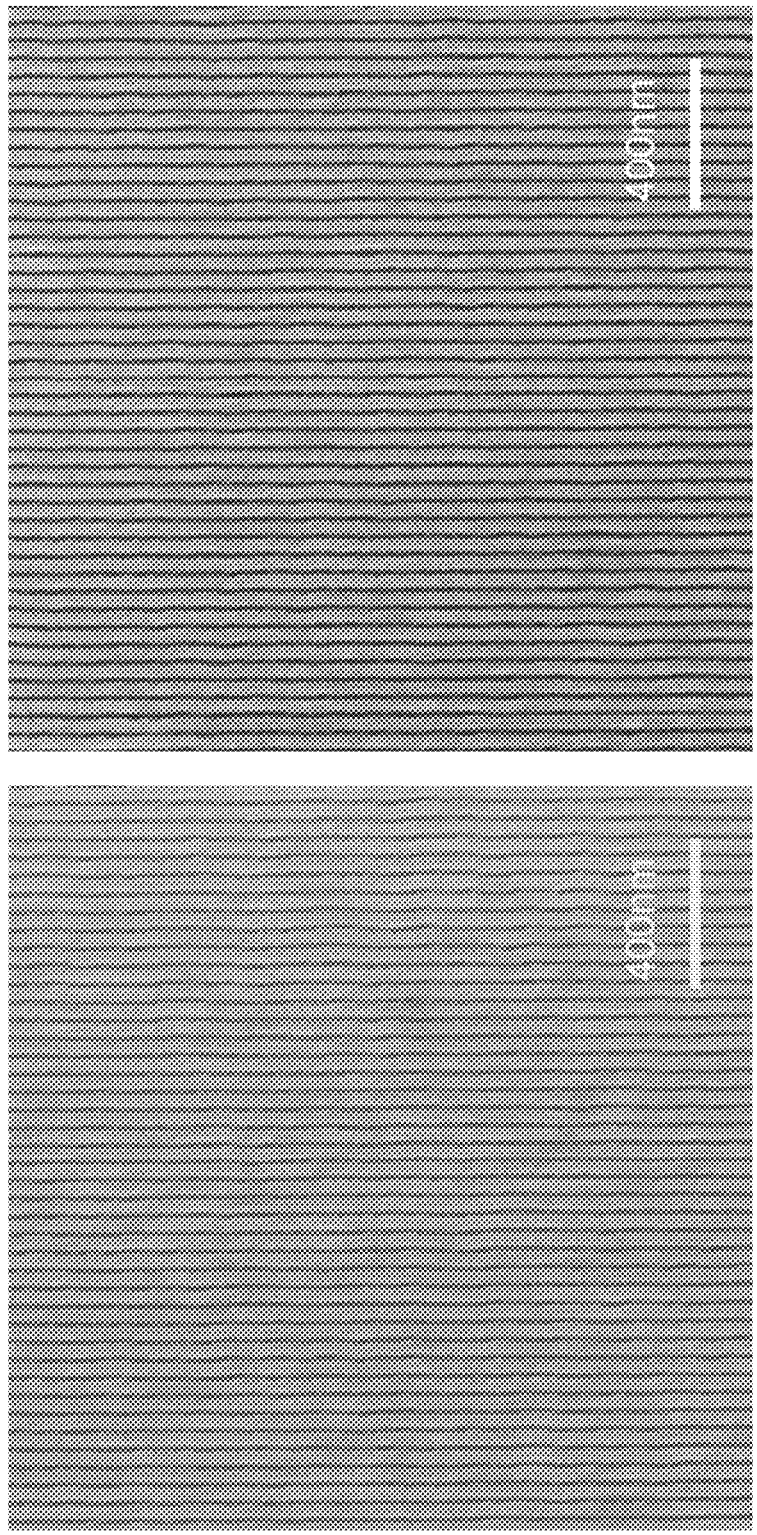

FIG. 13 shows SEM images of the $1^{st}$ and $20^{th}$ replica (i.e., the replica created from molecular transfer printing using the original master template and the replica created from molecular transfer printing using the $20^{th}$ regenerated master template.) No substantial defects in films or differences between the quality of the replicas from cycle to cycle were observed.

Example 2

Figure 14:
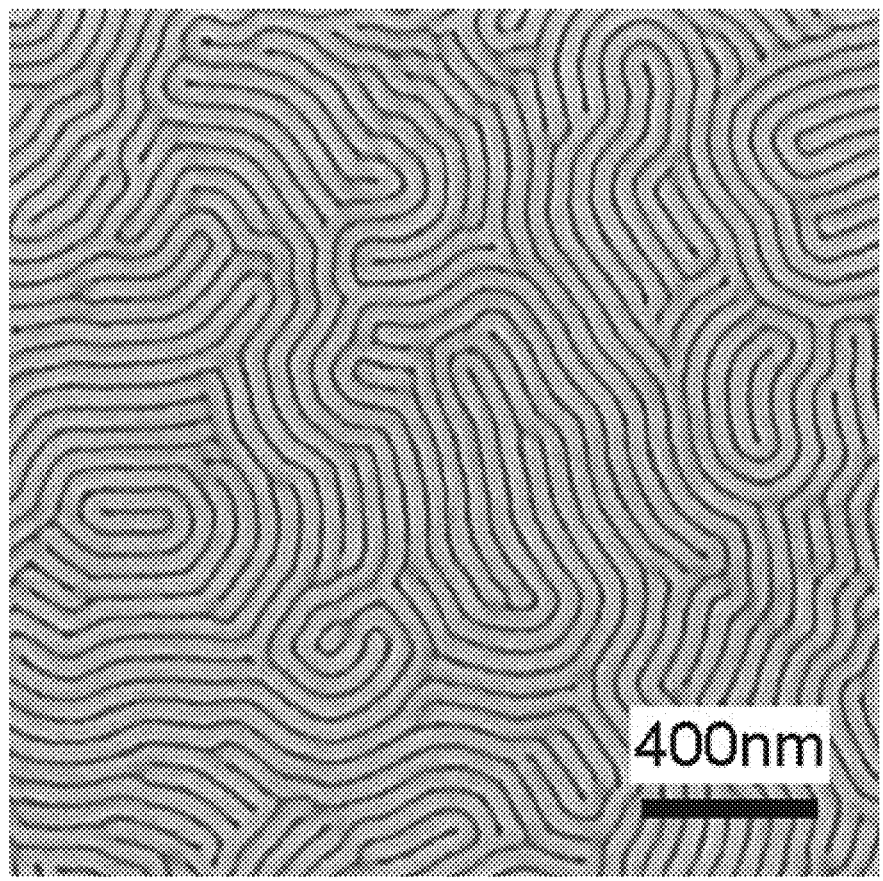

Block copolymer blend film was spun onto a wafer having a neutral surface and multiple raised areas or mesas of 50 nm in relief. Block copolymer blend film was formed on the unpatterned substrate, forming a "fingerprint" pattern with features of dimension about 25 nm. A second wafer was brought into contact with the wafer to transfer the pattern, and a block copolymer film was directed to assemble on the transferred pattern in accordance with the above experimental procedures. FIG. 14 is an SEM image of a block copolymer film directed to assemble on the transferred chemical pattern. The image shows that the complicated fingerprint pattern was transferred perfectly or near perfectly. Poor transfer of complicated fingerprint pattern was observed from the areas in between mesas, including little or no transfer was observed from the areas near the mesa edges.

Example 3

Figure 15:
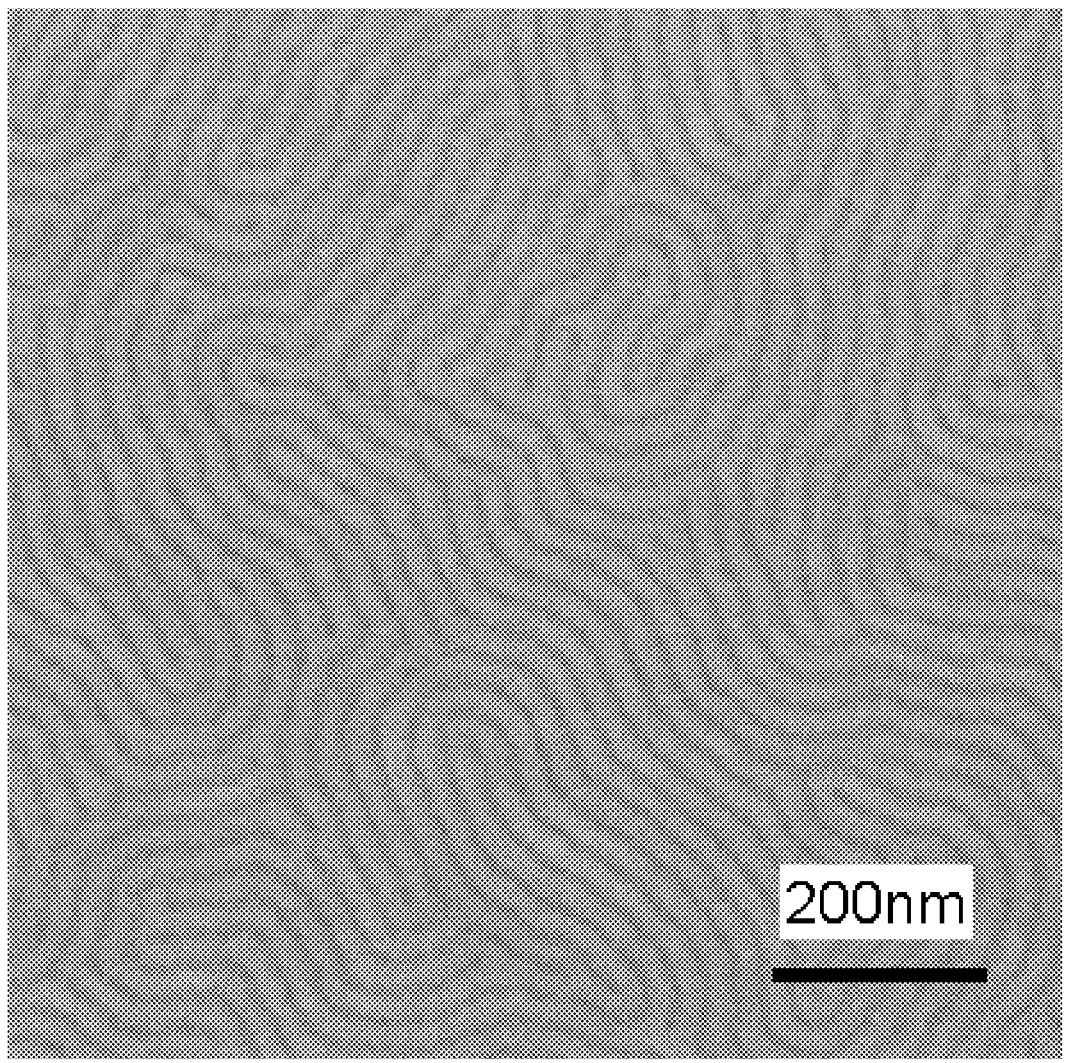
FIG. 15 shows an SEM image showing directed assembly of a replica of the complicated fingerprint pattern formed on neutral brush having features are about 15 nm wide.

In the above examples, a 52K-52K PS-b-PMMA block copolymer having a 47.5 nm bulk lamellar period was used. In this example, an 18K-18K PS-b-PMMA block copolymer having a lamellar period of 28.9 nm was used in the blend film. The blend film was assembled on a neutral surface, forming a fingerprint pattern, which was then transferred to a second wafer via the molecular transfer printing process described above. FIG. 15 shows an SEM image showing directed assembly of the exact replica of the complicated fingerprint pattern formed on neutral brush. The features are about 15 nm wide. This shows that the molecular transfer printing process works at very small dimensions, limited only the period of the block copolymer. The process would be similarly expected to produce substantially perfect replicas of patterns having dimensions in ones of nanometers (e.g., features having a smallest dimension of about 3 nm).

Experimental Procedure

Examples 4-8

Block copolymer: Various PS-b-PMMA blends:

Blend L50: 90 wt % poly(styrene-block-methyl methacrylate) (PS-b-PMMA, $M_t$ =52-52 kg·mol$^{-1}$), 5 wt % hydroxyl-terminated polystyrene (PS-OH, $M_n$=6 kg·mol$^{-1}$), and 5 wt % hydroxyl-terminated poly(methyl methacrylate) (PMMA-OH, $M_n$=6 kg·mol$^{-1}$). The blend naturally forms lamellae with a period, $L_B$, of 50.3 nm and PS-OH and PMMA-OH serve as inks.

Blend L30: 90 wt % PS-b-PMMA (18-18 kg·mol$^{-1}$), 5 wt % PS-OH (6 kg·mol$^{-1}$), and 5 wt % PMMA-OH (6 kg·mol$^{-1}$)]; the blend naturally forms lamellae with $L_B$=29.6 nm and PS-OH and PMMA-OH serve as inks.

Blend C35: 90 wt % PS-b-PMMA (46-21 kg·mol$^{-1}$), 7 wt % PS-OH (6 kg·mol$^{-1}$), and 3 wt % PMMA-OH (6 kg·mol$^{-1}$)]; the blend naturally forms cylinders with $L_B$=34.9 nm and PS-OH and PMMA-OH serve as inks.

Inks: PS-OH (preferentially to PS domains) and PMMA-OH (preferential to PMMA domains)

Forming blend film on first (master) master substrate: Solutions of 2.5 wt. % Blend L50 in toluene were spin coated on chemically neutral and nanopatterned substrates to yield films with thicknesses of about 100 nm, which were subsequently annealed at 190° C. for 24 h or 230° C. for 3 min, respectively, to induce equilibrium morphologies. Solutions of 2.5 wt. % Blend L30 were spin coated on neutral substrates to yield about 100-nm-thick films, which were annealed at 190° C. for 24 h. Solutions of 1.5 wt. % and 9 wt. % Blend C35 were deposited on silicon substrates to yield films with targeted thickness of about 50 nm and about 400 nm, which were annealed at 230° C. for 90 min to form parallel half-cylinders and perpendicular cylinders at film surfaces, respectively. The assembled blend films functioned as master templates for MTP.

Transferring pattern: An oxygen-plasma-cleaned silicon substrate was placed in contact with the surface of the master template. The sandwiched structure was annealed at 160° C. for 24 h.

Separating substrates: Sandwich structure separated by dissolving the polymers by repeated sonication in chlorobenzene to yield the replica (and regenerate the original template for chemically patterned substrates).

Using transferred pattern to direct assembly of block copolymer film: The corresponding block copolymers and blends with commensurate periods were then spin-coated from toluene solutions to from 50-nm-thick films onto the replicas and annealed at 190° C. for 24 h on fingerprint and dot patterns or 230° C. for 3 min on stripe patterns.

Example 4

A 100-nm-thick film of Blend L50 was assembled on a non-preferential wetting surface such that the lamellae were oriented perpendicular to the substrate in a fingerprint pattern. A silicon substrate with a native oxide layer, the replica substrate, was then placed in contact with the film surface. Upon annealing at elevated temperature, above the glass transition temperatures ($T_g$) of both blocks of the copolymer but below the order-disorder temperature, the inks reacted with the replica surface, creating a pattern of PS and PMMA brushes reflecting the domain structure at the interface. The block copolymer and unreacted homopolymers were subsequently dissolved and the master and replica substrates were separated. After MTP, the brushes on the replica were analyzed by atomic force microscopy (AFM). When both PS-OH and PMMA-OH inks were incorporated into the blend, the AFM phase image showed fingerprint patterns of adjacent PS and PMMA brush regions with a period of about 50.1 nm. Where non-reactive PMMA homopolymer (or no PMMA) was incorporated into the blend, a pattern of PS brushes and the exposed substrate was observed in the AFM phase image.

Example 5

Masters were prepared using lithography and replicated using MTP to create multiple numbers of copies. Chemical patterns consisting of arrays of stripes with periods, $L_s$, of 45 nm, 47.5 nm and 50 nm were written on the master using extreme ultra violet interference lithography (EUV-IL). Blend L50 was directed to assemble on the master to create alternating PS and PMMA lamellar domains that are 1) oriented perpendicular to the substrate, 2) registered with the underlying chemical pattern, and 3) matched in period with the underlying pattern, even at dimensions different than $L_B$. After MTP, dissolution of the polymer film, and substrate separation, a replica with alternating stripes of PS and PMMA brushes was obtained and the master was also recovered. The master and the replica were subsequently used to direct the assembly of freshly deposited films of Blend L50. This process was repeated for 20 cycles using a single master without noticeable deterioration of the pattern quality and 20 identical replicas were created from the same master. Fast Fourier-transfer (FFT) analysis of the SEM images of the assembled films on the master of the $20^{th}$ cycle and the $20^{th}$ replica revealed the remarkable pattern transfer fidelity; the PS and PMMA domains have essentially identical periods on masters and replicas alike, for commensurate and incommensurate values of $L_S$ and $L_B$.

Example 6

Figure 16:
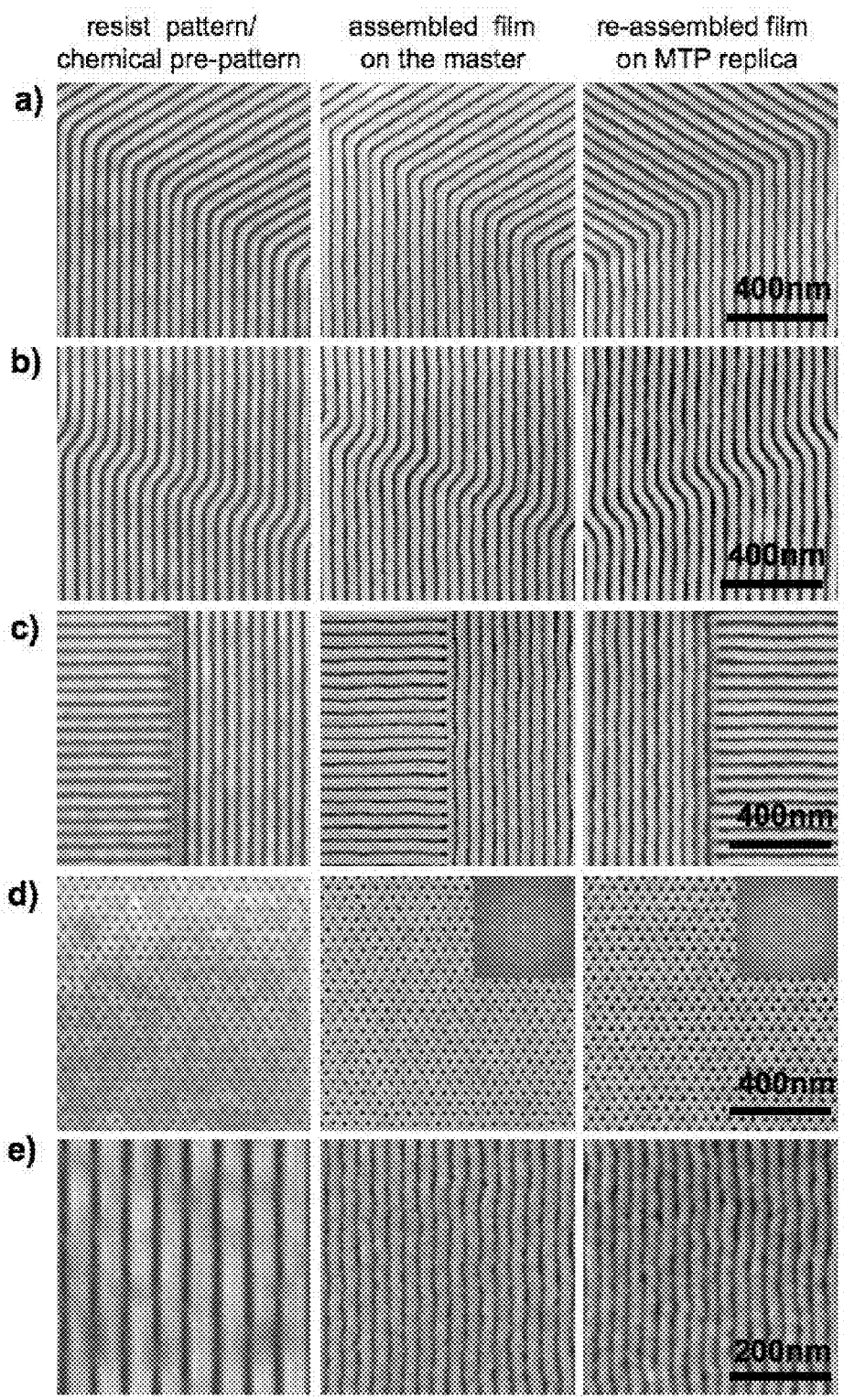
FIGS. 16a-e show SEM images of photoresist patterns (indicating a chemical pre-pattern) (left), polymer blend films assembled on the masters having those chemical pre-patterns (middle) and the corresponding replicas (right) for various chemical pre-patterns.

The methods described herein may be used to make replicas of device-oriented patterns. Substrates were patterned with e-beam lithography to form arrays of 120° bends, jogs and T-junctions. Masters were made by assembling blend L50 films on the patterned substrates. Molecular transfer printing was then performed to create replicas. All patterns were replicated with a high degree of fidelity. FIGS. 16a-c show SEM images of the photoresist pattern, indication of the chemical pre-pattern (left), polymer blend films assembled on the masters (middle) and the corresponding replicas (right). Molecular transfer printing replicates arrays of 120° bends (FIG. 16a); jogs (FIG. 16b); and T-junctions (FIG. 16c) with high fidelity, and the domain structures in the assembled films on masters and replicas are mirror images. This demonstrates the perfection and quality of the molecular transfer process in replicating features for the fabrication of integrated circuits.

Example 7

Hexagonally packed cylinders were directed to assemble on masters patterned with hexagonal arrays of spots ($L_S$ of 45 nm) using a blend C45 polymer blend. After molecular transfer printing, highly ordered arrays of cylinders were reassembled on the replica with high degree of perfection. FIG. 16d shows the photoresist pattern, indication of the chemical pre-pattern (left), C45 blend assembled on the master (middle) and the corresponding replica (right). The insets are FFTs of the images. Discrete dot patterns may be used in the fabrication of integrated circuits.

Example 8

A master was fabricated by assembling a 30 nm period blend on 60-nm-pitch chemical pattern by density multiplication. This technique allows substrates to be pre-patterned at sub-lithographic resolutions. A chemical pre-pattern ($L_S$=60 nm) of alternating stripes with widths of approximately 15 nm and 45 nm that are preferentially wet by PMMA and PS, respectively, was prepared. This master was used to direct the assembly of lamellae-forming blend L30 with $L_B$=29.6 nm. In comparing the master pre-pattern with the assembled film of blend L30, the density of features is multiplied by a factor of two. Molecular transfer printing from the surface of this film generated a chemical pre-pattern on the replica and subsequent reassembled film on the replica, with 15 nm features and 30 nm period. FIG. 16e shows SEM images of the photoresist pattern (left) and blend L30 films assembled on the master by 2× density multiplication (middle) and its corresponding replica (right). The replica can then direct the assembly of the same blend in 1:1 fashion.

Example 9

Large area replication by molecular transfer printing was performed by conformally coating a master EUV-IL pattern having nine exposure films of 1×1.4 mm each. A 30-nm-thick silicon oxide layer was deposited on a master block copolymer film by chemical vapour deposition. During molecular transfer printing, inks react with the silicon oxide to form chemical pre-patterns at the film-oxide interface. A thin oxide replica supported on a carrier wafer showed replication of the 50 the 50-nm-pitch patterned areas of the master. The oxide, after pattern transfer from the assembled block copolymer film, may serve as a hard mask for further pattern transfer to the underlying carrier substrate, and deposition of the oxide through a stencil mask may enable molecular transfer printing on thin oxide replicas only in predefined regions. In one embodiment a total replication area of up to 1 cm×1 cm or higher may be achieved by a conformal coating process.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:

1. A method of printing a chemical pattern on a substrate comprising:
   providing a block copolymer/ink blend film, said blend film comprising microphase-separated domains of a block copolymer material and one or more inks preferentially segregated in at least one of the domains of the block copolymer material; and
   transferring at least one ink of the one or more inks to a transferee substrate to thereby print a chemical pattern on the transferee substrate, wherein the chemical pattern is defined by the microphase-separated domains of the block copolymer material at a surface of the blend film.

2. The method of claim 1 wherein providing a block copolymer/ink blend film comprises directing assembly of a block copolymer film on a first chemically patterned substrate.

3. The method of claim 1 wherein the at least one ink is transferred to the transferee substrate by a chemical reaction at the surface of the transferee substrate.

4. The method of claim 1 wherein the at least one ink is transferred to the transferee substrate by adsorption onto the transferee substrate.

5. The method of claim 1 wherein transferring at least one ink comprises physically contacting the blend film with the transferee substrate.

6. The method of claim 1 wherein transferring the at least one ink comprises heating the blend film to at least 5° C. above the glass transition temperatures of its component copolymers.

7. The method of claim 1 wherein at least a portion of blend film surface is without topographical features, wherein said portion includes multiple features of the pattern to be printed.

8. The method of claim 1 wherein providing the block copolymer/ink blend film comprises assembling a block copolymer film on a first substrate.

9. The method of claim 8 wherein a pattern in the block copolymer film at the interface with the first substrate differs from a pattern in the block copolymer film at a free surface of the film.

10. The method of claim 1 wherein the at least one ink comprises a compound having a first functional group to interact with the transferee substrate and a second functional group to polymerize and/or conjugate another molecule to the transferee substrate.

11. The method of claim 1 wherein transferring the at least one ink comprises conformally depositing a transferee substrate material on at least a portion of the blend film.

12. The method of claim 1 wherein at least one ink molecule comprises a homopolymer of the one of the components of the block copolymer.

13. The method of claim 1 wherein at least one ink molecule comprises a nanoparticle or a non-volatile small molecule.

14. The method of claim 1 wherein only a subset of the microphase-separated domains of the block copolymer material are inked.

15. The method of claim 1 wherein all of the microphase-separated domains of the block copolymer material are inked.

16. A method of generating a replica of a chemical pattern, comprising:
   providing a first substrate having a master template comprising domains of a microphase-separated block copolymer material and one or more inks preferentially segregated in at least one of the domains of the block copolymer material;
   transferring at least one ink of the one or more inks to a transferee substrate to thereby print a chemical pattern on a transferee substrate, wherein the chemical pattern is defined by the microphase-separated domains of the block copolymer material at a surface of the blend film; and
   directing assembly of a block copolymer film on the transferee substrate based on the chemical pattern printed thereon to thereby form a replica of the master template.

17. The method of claim 16 further comprising directing the assembly of a block copolymer film on a chemically nanopatterned surface to generate the master template.

18. The method of claim 16 wherein the first substrate comprises a lithographically patterned surface.

19. The method of claim 16 further comprising reusing the master template to generate one or more additional replicas.

20. The method of claim 16 further comprising, after printing a chemical pattern on the transferee substrate, regenerating the master template on the first substrate.

21. The method of claim 16 wherein the transferee substrate comprises inked and uninked regions.

22. The method of claim 21 further comprising filling the uninked regions with an ink molecule.

23. A method of printing a chemical pattern on a substrate comprising:

providing a polymer/ink blend film, said blend film comprising a domain-separated polymer material and one or more inks preferentially segregated in at least one of the domains of the polymer material; and transferring at least one ink of the one or more inks to a transferee substrate to thereby print a chemical pattern on the transferee substrate, wherein the chemical pattern is defined by the separated domains of the polymer material at a surface of the blend film.

* * * * *